US012787632B2

(12) United States Patent
Yan et al.

(10) Patent No.: US 12,787,632 B2
(45) Date of Patent: Nov. 3, 2026

(54) POLYMER HOLE-TRANSPORTING MATERIALS AND APPLICATION THEREOF

(71) Applicant: The Hong Kong University of Science and Technology, Hong Kong (CN)

(72) Inventors: He Yan, Hong Kong (CN); Shangshang Chen, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 0 days.

(21) Appl. No.: 19/234,709

(22) Filed: Jun. 11, 2025

(65) Prior Publication Data

US 2025/0386724 A1 Dec. 18, 2025

Related U.S. Application Data

(60) Provisional application No. 63/659,155, filed on Jun. 12, 2024.

(51) Int. Cl.

| | |
|---|---|
| ***H10K 85/10*** | (2023.01) |
| ***C08G 61/12*** | (2006.01) |
| ***H10K 30/40*** | (2023.01) |
| ***H10K 30/50*** | (2023.01) |
| ***H10K 30/57*** | (2023.01) |
| ***H10K 30/86*** | (2023.01) |

(52) U.S. Cl.

CPC ........... *H10K 85/111* (2023.02); *H10K 30/40* (2023.02); *H10K 30/50* (2023.02); *H10K 30/57* (2023.02); *H10K 30/86* (2023.02); *H10K 85/115* (2023.02); *H10K 85/151* (2023.02); *C08G 61/121* (2013.01); *C08G 61/124* (2013.01); *C08G 2261/11* (2013.01); *C08G 2261/122* (2013.01); *C08G 2261/124* (2013.01); *C08G 2261/147* (2013.01); *C08G 2261/148* (2013.01); *C08G 2261/312* (2013.01); *C08G 2261/3162* (2013.01); *C08G 2261/3241* (2013.01); *C08G 2261/512* (2013.01); *C08G 2261/91* (2013.01)

(58) Field of Classification Search

CPC .. H10K 85/111; H10K 85/151; H10K 85/115; H10K 30/50; H10K 30/40; H10K 30/57; H10K 30/86

See application file for complete search history.

(56) References Cited

U.S. PATENT DOCUMENTS

2016/0322591 A1* 11/2016 Seok .......................... C07F 7/24

* cited by examiner

*Primary Examiner* — Lindsey A Buck

(74) *Attorney, Agent, or Firm* — WPAT, PC

(57) ABSTRACT

The present invention discloses several kinds of polymer hole-transporting material, comprising homopolymers or copolymers. The present invention also shows application in inverted-structure perovskite solar cells.

7 Claims, No Drawings

POLYMER HOLE-TRANSPORTING MATERIALS AND APPLICATION THEREOF

CROSS REFERENCE TO RELATED APPLICATIONS

This application claims priority to and the benefit of U.S. Provisional Patent Application Ser. No. 63/659,155 filed on Jun. 12, 2024, the disclosure of which is incorporated by reference in its entirety.

TECHNICAL FIELD

The present invention relates to polymer hole-transporting materials, and applies them into perovskite solar cell devices.

BACKGROUND

A perovskite solar cell (PSC) is a type of solar cell that includes a perovskite-structured compound, most commonly a hybrid organic-inorganic lead or tin halide-based material as the light-harvesting active layer. PSCs are promising light-harvesting devices due to their high efficiencies, facile integration into tandem devices, and high potential for low-cost manufacturing due to simple processing techniques, such as roll-to-roll printing.

In general, PSCs can be classified into two architecture types, NIP and PIN, where the difference is defined by the order of deposition of the electron and hole selective contacts relative to the transparent conductive oxide (TCO) substrate.

PSCs include hole-transport materials (HTMs), which play a vital role in both device stability and efficiency by facilitating hole extraction and suppressing charge recombination between the anode and perovskite layers while assisting in charge separation and conduction of holes to the cathode of the PSCs. For example, PIN devices are fabricated so that light can pass through multiple layers prior to reaching the active perovskite layer, where it is eventually absorbed. These layers include the glass protective layer, anode, and HTM.

Organic materials are often selected as HTMs because of their tunable thermal and optoelectronic properties, as well as their ability to be vacuum- and/or solution-processed into devices. Most commonly, these organic materials comprise small molecules and polymers containing the triarylamine moiety, which can be modified to match device needs. (Poly)arylamine-based materials are a frequent choice for HTMs in PSCs due to their electron-rich nature and high excited-state stability, which is attributable to resonance in adjacent conjugated groups. The current benchmark materials for both NIP and PIN devices are poly[bis(4-phenyl)-(2,4,6-trimethylphenyl)amine](PTAA), 2,2',7,7'-tetrakis(N,N-di-p-methoxyphenylamine)-9,9'-spirobiflurorene (spiro-OMeTAD), poly(3,4-ethylenedioxythiophene) polystyrene sulfonate (PEDOT:PSS), [2-(9H-carbazol-9-yl)ethyl]phosphonic acid (2PACz), and poly(3-hexylthiophene-2,5-diyl) (P3HT).

HTMs are an integral component of many diode devices such as solar (e.g., PSCs), OLED, photodetectors, and lasers to name a few. Current HTM lack in the ability to fulfill properties required for these applications such as high glass transition temperatures (Tg, above 150° C.), tunable energy levels (i.e., HOMO, LUMO) to match adjacent layers in the device, passivation to address defects at the HTM-perovskite interface, and wettability to allow for ohmic contact of adjacent layers in the device.

There is thus a need in the art for new HTMs that can not only be easily tuned for different perovskites, but that can also be easily processed (e.g., solution-processed) with high perovskite ink affinity while demonstrating high performance properties required for HTMs for use in PSCs.

SUMMARY

In a first embodiment, a first polymer hole-transporting material is provided. The first polymer hole-transporting material comprises a copolymer based on triarylamine monomer and carbazole monomer, triarylamine monomer comprises a backbone structure:

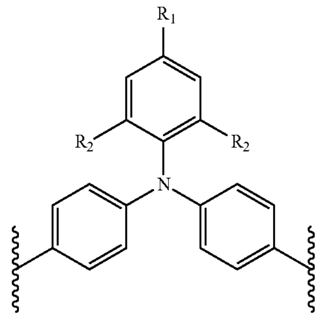

wherein $R_1$ is selected from the groups consisting of alkyl chain containing H, F, Cl, Br, I, CN, vinyl, acids or their combination;

$R_2$ is independently a straight chain or branched alkyl group and wherein one or more H atoms are optionally replaced by F, Cl, Br, I, or CN.

Carbazole monomer contains an alkyl chain directly bonded to the nitrogen atom of the carbazole structure, and the alkyl chain is of 1 to 11 carbon atoms, and also has X terminal and Y terminal, wherein X is H or CN, Y is selected from:

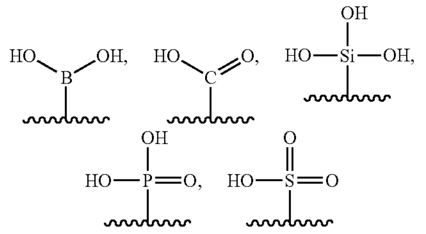

In a second embodiment, a second polymer hole-transporting material is provided. The second polymer hole-transporting material comprises a polymer based on benzene monomer or fluorene monomer or their combination, benzene monomer or fluorene monomer is selected from the group consisting of:

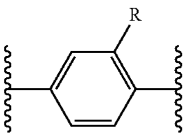

or

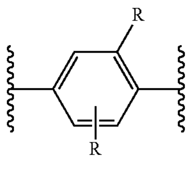

or

-continued

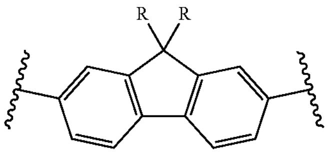

wherein R is independently selected from the groups consisting of alkyl chain containing H, F, Cl, Br, I, CN, vinyl, acids or their combination.

In a third embodiment, a third polymer hole-transporting material is provided. The second polymer hole-transporting material comprises a polymer based on fused carbazole monomer, fused carbazole monomer is selected from the group consisting of:

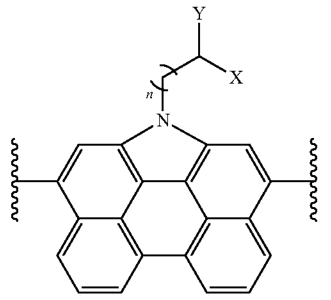

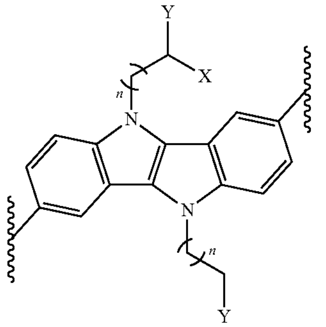

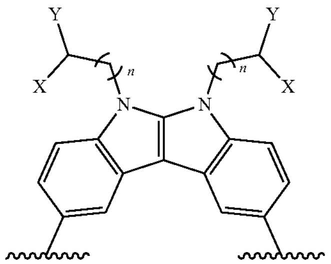

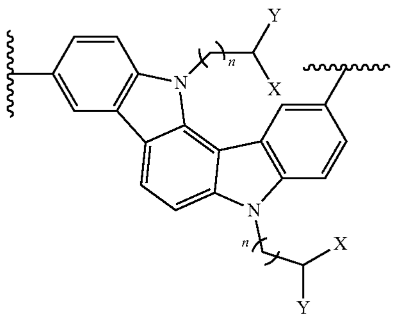

-continued

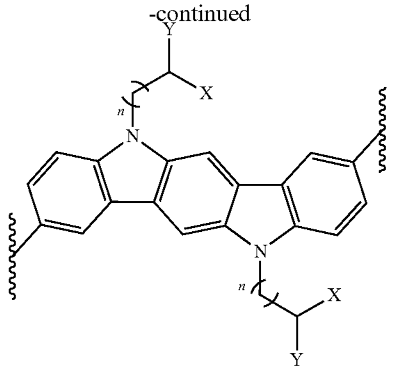

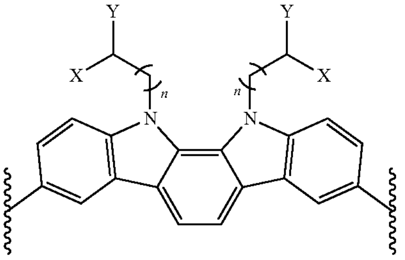

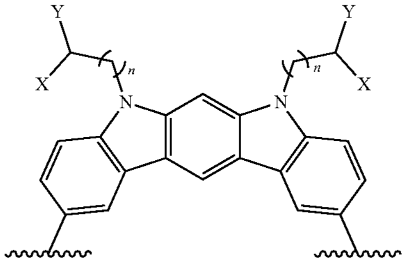

wherein X is independently H or CN;

n is independently selected from integers of 0 to 10; and

Y is independently selected from:

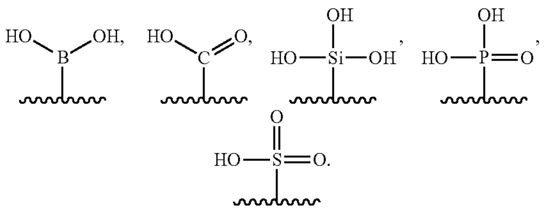

In a fourth embodiment, a fourth polymer hole-transporting material is provided. The fourth polymer hole-transporting material comprises a conjugated polymer comprises one or more repeating unit, the repeating unit has at least one phosphoric acid group $[P(O)(OH)_2]$ and at least one cyano group (C≡N) on one side chain.

In a fifth embodiment, an inverted perovskite solar cell with a p-i-n architecture is provided. The inverted perovskite solar cell comprises a hole-transporting layer includes the first or the second or the third or the fourth polymer hole-transporting material of the above-mentioned embodiments.

Preferred, the inverted perovskite solar cell can be either a single-junction solar cell or at least one sub-cell of a multi-junction solar cell.

Preferred, the inverted perovskite solar cell can be arranged as an inverted perovskite sub-cell on a silicon heterojunction sub-cell in a tandem solar cell.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

DETAILED DESCRIPTION

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, (Pm or Vmp*Jmp), to the theoretical (not actually obtainable) power, (Jsc*Voc). Accordingly, FF can be determined using the equation:

$$FF = (Vmp * Jmp)/(Jsc * Voc)$$

where Jmp and Vmp represent the current density and voltage at the maximum power point (Pm), respectively, this point being obtained by varying the resistance in the circuit until J*V is at its greatest value; and Jsc and Voc represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (Voc) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/$m^2$) under standard test conditions (STC) and the surface area of the solar cell (Ac in $m^2$). STC typically refers to a temperature of 25° C. and an irradiance of 1000 W/$m^2$ with an air mass 1.5 (AM 1.5) spectrum.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, blade coating, and the like.

As used herein, a "polymeric compound" (or "polymer") refers to a molecule including a plurality of one or more repeating units connected by covalent chemical bonds. A polymeric compound can be represented by General Formula I:

General Formula I $$*\!-\!\!\left(\!(Ma)x-(Mb)y-\right)\!z*$$

wherein each Ma and Mb is a repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which co-monomers Ma and Mb is repeated can be alternating, random, region-random, region-regular, or in blocks, with up to z co-monomers present. In addition to its composition, a polymeric compound can be further characterized by its degree of polymerization (n) and molar mass (e.g., number average molecular weight (Mn) and/or weight average molecular weight (Mw) depending on the measuring technique(s)).

As used herein, "alkyl" refers to a straight chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl, tert-pentyl), hexyl groups, and the like. In various embodiments, an alkyl group can have 1 to 40 carbon atoms (i.e., C1-C40 alkyl group), for example, 1-30 carbon atoms (i.e., C1-C30 alkyl group). In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In some embodiments, alkyl groups can be substituted as described herein. An alkyl group is generally not substituted with another alkyl group, an alkenyl group, or an alkynyl group.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly rr-conjugated and optionally substituted as described herein.

In a first embodiment of the present invention, a first polymer hole-transporting material is provided. The first polymer hole-transporting material comprises a copolymer based on triarylamine monomer and carbazole monomer, triarylamine monomer comprises a backbone structure:

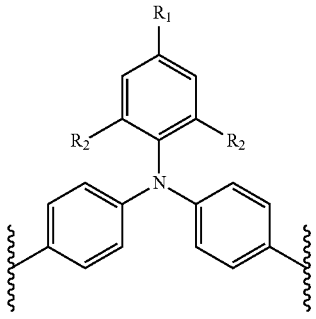

wherein $R_1$ is selected from the groups consisting of alkyl chain containing H, F, Cl, Br, I, CN, vinyl, acids or their combination;

$R_2$ is independently a straight chain or branched alkyl group and wherein one or more H atoms are optionally replaced by F, Cl, Br, I, or CN.

Carbazole monomer contains an alkyl chain directly bonded to the nitrogen atom of the carbazole structure, and the alkyl chain is of 1 to 11 carbon atoms, and also has X terminal and Y terminal, wherein X is H or CN, Y is selected from:

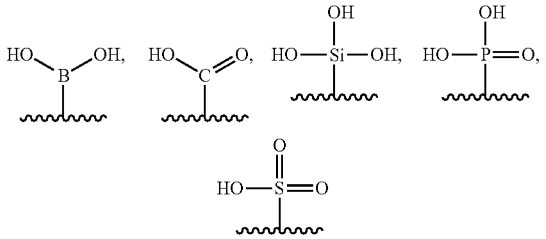

Furthermore, carbazole monomer can be selected from the group consisting of:

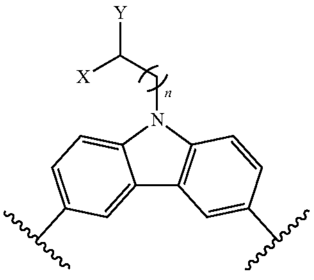

-continued

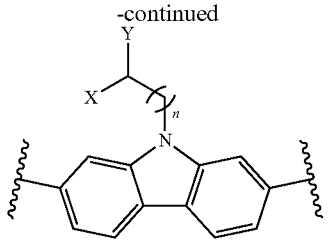

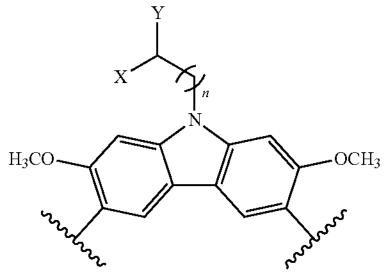

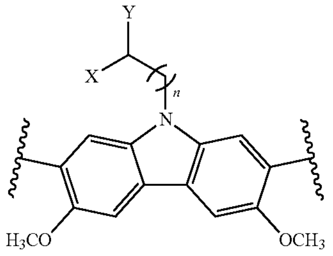

wherein X is independently H or CN;
n is independently selected from integers of 0 to 10; and
Y is independently selected from:

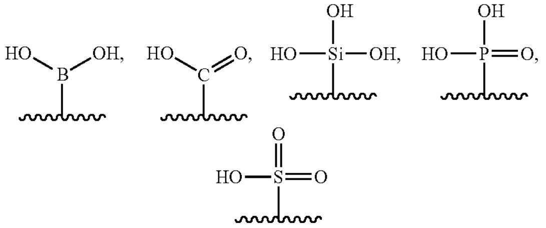

Preferred, X is CN and Y is

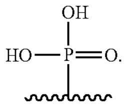

The triarylamine monomer can be selected from the group consisting of:

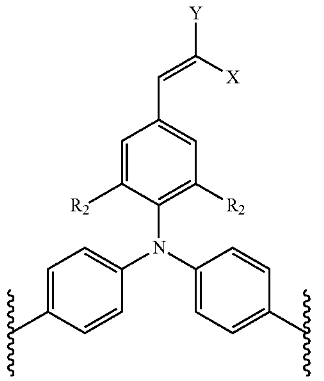

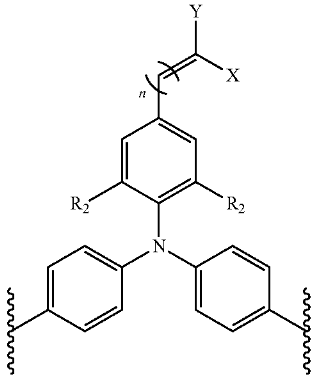

wherein X is independently H or CN;
n is independently selected from integers of 0 to 10; and
Y is independently selected from:

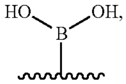, 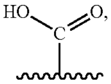, 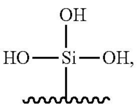, 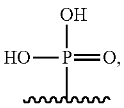,

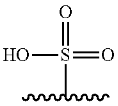

In this embodiment, the ratio between triarylamine monomer and carbazole monomer ranges from 0.2 to 5.

In this embodiment, the average molecular weight of the copolymer is in a range from about 1,000 to about 1,000,000 Da.

In a second embodiment of the present invention, a second polymer hole-transporting material is provided. The second polymer hole-transporting material comprises a polymer (hereinafter as Polymer A) based on benzene monomer or fluorene monomer or their combination, benzene monomer or fluorene monomer is selected from the group consisting of:

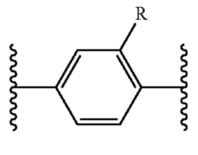 or 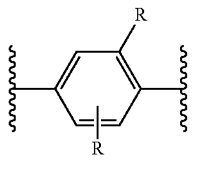 or

-continued

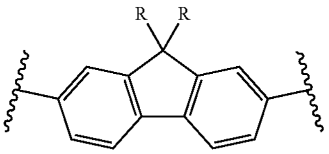

wherein R is independently selected from the groups consisting of alkyl chain containing H, F, Cl, Br, I, CN, vinyl, acids or their combination.

Furthermore, benzene monomer can be selected from the group consisting of:

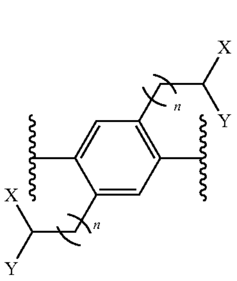 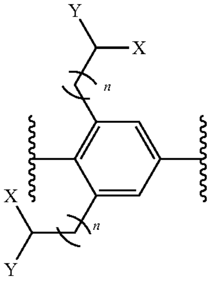

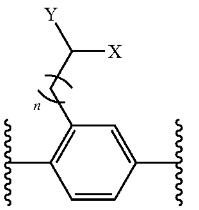 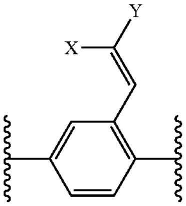 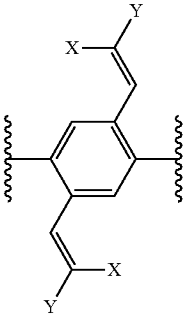

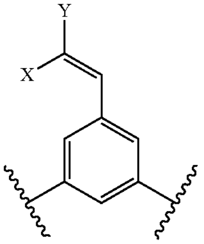

wherein X is independently H or CN;
n is independently selected from integers of 0 to 10; and
Y is independently selected from:

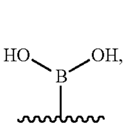, 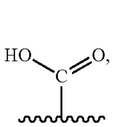, 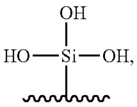, 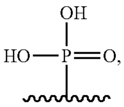,

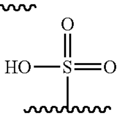

Preferred, X is CN and Y is

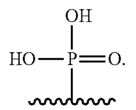 [SMILES: *P(=O)(O)O]

More preferred, benzene monomer comprises a backbone structure:

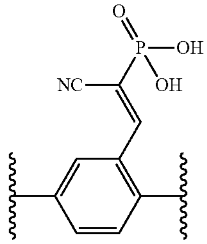 [SMILES: *c1ccc(*)c(/C=C(\C#N)P(=O)(O)O)c1]

In this embodiment, Polymer A can be homopolymer or copolymer. The average molecular weight of Polymer A is in a range from about 1,000 to about 1,000,000 Da.

Additionally, the second polymer hole-transporting material may adopt other monomers to produce a polymer (hereinafter as Polymer B) to fulfill properties required in PSCs. Polymer B is a copolymer based on monomer I and monomer II, monomer I is benzene monomer or fluorene monomer or their combination, benzene monomer or fluorene monomer is selected from the group consisting of:

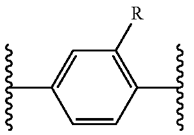

or

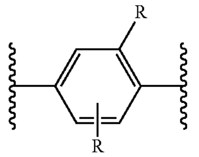

or

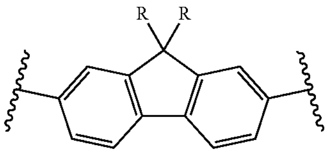

wherein R is independently selected from the groups consisting of alkyl chain containing H, F, Cl, Br, I, CN, vinyl, acids or their combination.

Monomer II is triarylamine monomer or carbazole monomer or their combination, triarylamine monomer comprises a backbone structure:

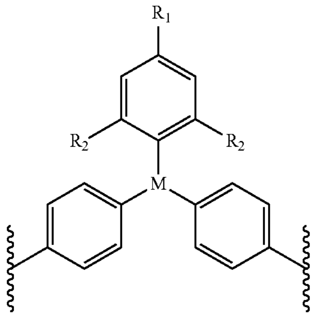

wherein $R_1$ is selected from the groups consisting of alkyl chain containing H, F, Cl, Br, I, CN, vinyl, acids or their combination;

$R_2$ is independently a straight chain or branched alkyl group and wherein one or more H atoms are optionally replaced by F, Cl, Br, I, or CN.

Carbazole monomer contains an alkyl chain directly bonded to the nitrogen atom of the carbazole structure, and the alkyl chain is of 1 to 11 carbon atoms, and also has X terminal and Y terminal, wherein X is H or CN, Y is selected from:

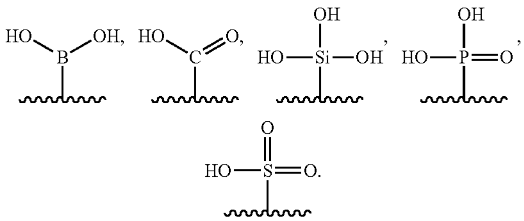

Furthermore, carbazole monomer can be selected from the group consisting of:

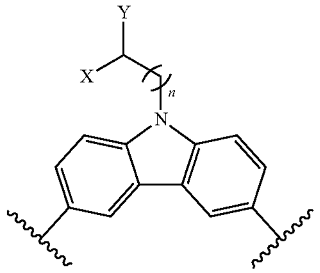

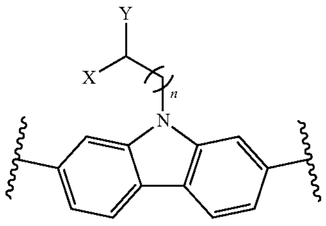

-continued

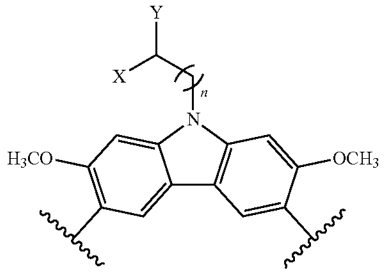

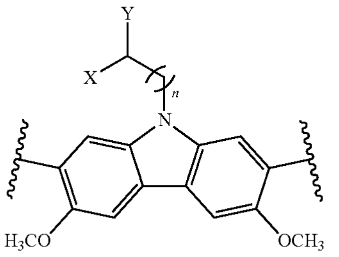

wherein X is independently H or CN;

n is independently selected from integers of 0 to 10; and

Y is independently selected from:

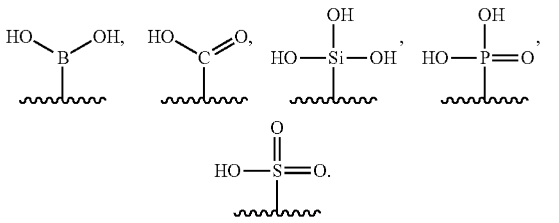

Preferred, X is CN and Y is

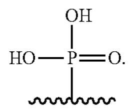

In a third embodiment, a third polymer hole-transporting material is provided. The third polymer hole-transporting material comprises a polymer based on fused carbazole monomer, fused carbazole monomer is selected from the group consisting of:

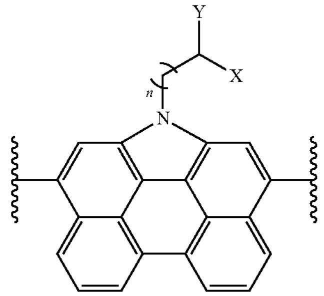

-continued

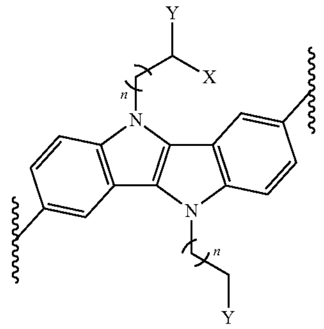

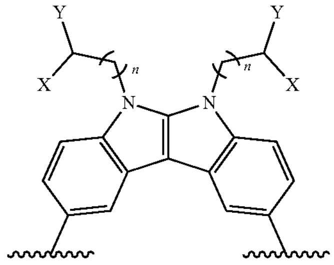

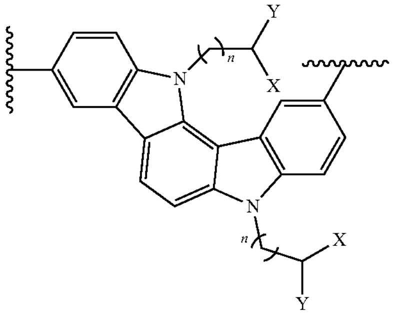

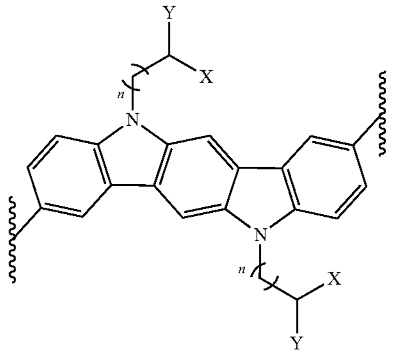

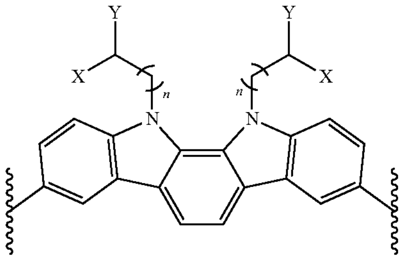

-continued

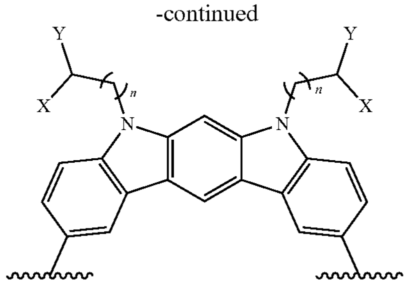

wherein X is independently H or CN;

n is independently selected from integers of 0 to 10; and

Y is independently selected from:

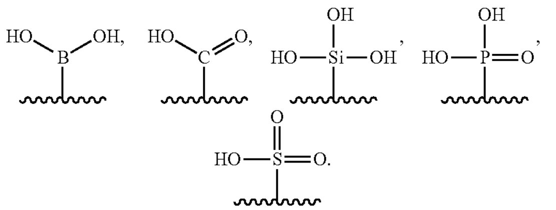

Preferred, X is ON and Y is

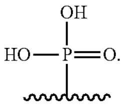

In this embodiment, the polymer can be homopolymer or copolymer. The average molecular weight of the polymer is in a range from about 1,000 to about 1,000,000 Da.

In a fourth embodiment, a fourth polymer hole-transporting material is provided. The fourth polymer hole-transporting material comprises a conjugated polymer comprises one or more repeating unit, the repeating unit has at least one phosphoric acid group $[P(O)(OH)_2]$ and at least one cyano group (C≡N) on one side chain.

Preferred, the conjugated polymer comprises one or more repeating unit, the repeating unit is selected from the group consisting of:

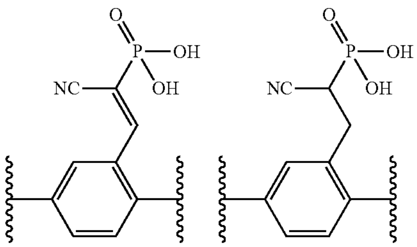

Preferred, conjugated polymer is substantially free of triarylamine structure and carbazole structure.

Application in Inverted Perovskite Solar Cells (PSCs)

Inverted perovskite solar cells (PSCs) with a p-i-n architecture have gained significant attention in both academia and industry due to their compatibility with large-scale production and potential for enhanced device stability. However, most reports of high-efficiency p-i-n PSCs are typically small-size spin-coated devices fabricated in an inert atmosphere and also need further improvement in stability to meet industry standards. It is thus crucial to develop efficient and stable PSCs that are processed under ambient conditions using coating methods compatible with large-area production.

To achieve uniform large-area production of p-i-n perovskite solar devices, a key step is to coat perovskite inks onto the surface of hole-transporting materials (HTMs) via blade or slot-die coatings. In this process, the wettability, uniformity, and stability of HTMs on transparent conductive oxide (TCO) substrates have critical effects on the quality of perovskite films and the performance of devices.

Ideal HTMs should not only transport holes with good uniformity but also facilitate the coverage and crystallization of perovskite films for scalable production, particularly under ambient conditions in which environmental factors (e.g. moisture and oxygen) can have significant effects on the perovskite crystallization process.

There are generally two types of organic HTMs used in state-of-the-art p-i-n PSCs, one being small molecular self-assembled monomers (SAMs) like carbazole phosphonic acids (PACzs) and the other being polymeric materials such as PTAA. These two types of HTMs both have some advantageous features and also serious drawbacks. First, small molecular PACz SAMs has a small window of optimal thickness and also have poor uniformity via large-area coating. As a result, engineers in the PSC industry often encountered either excessive thickness and thus poor hole transport, or partial coverage of SAM on the bottom electrode leading to charge recombination at the interface. For these reasons, SAM-based HTMs are probably not considered a suitable option by the PSC industry currently.

On the other side, polymeric HTMs such as PTAA can have better coating uniformity and charge transport ability, which can overcome the weakness of SAMs. However, the surface of PTAA is too hydrophobic for uniform large-area coating of perovskite inks. In addition, PTAA-based PSCs appear to have lower efficiencies than SAM-based devices, which could be attributed to, among other factors, the lack of the phosphonic acid groups that can not only bond to the electrode surface but also provide passivation effects to the perovskite layer.

Furthermore, PTAA is highly phobic to the perovskite ink precursors, which typically means an interfacial layer or post-deposition modification with UV and ozone is required to deposit a satisfactory absorber layer. Thus, HTMs like PTAA may require an additional post-deposition process to improve the wettability of the HTMs to the perovskite inks.

In a fifth embodiment of the present invention, a perovskite solar cell is provided. The perovskite solar cell includes a hole-transporting layer, and the hole-transporting layer comprises the first or the second or the third or the fourth polymer hole-transporting material of the above-mentioned embodiments.

Moreover, the perovskite solar cell can be an inverted-structure perovskite solar cell. the perovskite solar cell can further comprise a substrate, a perovskite active layer, an electron-transporting layer, a blocking layer and a metal electrode. The substrate can be selected from the group consisting of glass/ITO substrate, glass/FTO substrate, PET/ITO substrate, and a combination thereof.

Single-Junction Solar Cells Vs. Multi-Junction Solar Cells

Single-junction solar cells use a single semiconductor material for the p-n junction, while multi-junction (or tandem) solar cells incorporate multiple p-n junctions with different materials to absorb varying wavelengths of light, improving efficiency.

Single-junction solar cells utilize a single p-n junction formed by doping two semiconductor materials (typically n-type and p-type), which limits in their ability to absorb the full spectrum of sunlight, resulting in lower efficiency compared to multi-junction cells.

Multi-junction (tandem) solar cells employ multiple p-n junctions, each made of a different semiconductor material with a specific bandgap. Each junction absorbs a different range of wavelengths of the solar spectrum, allowing for broader sunlight absorption and higher efficiency. Multi-junction solar cells can be designed as tandem (two-junction), triple-junction, quadruple-junction, and beyond.

Conventional single-junction solar cells typically composed of a single semiconductor material, such as monocrystalline or polycrystalline silicon. These materials absorb solar radiation within a specific range and convert it into electrical energy. On the other hand, perovskite tandem solar cells combine perovskite materials with other semiconductor materials (such as silicon) in layers to utilize the light absorption characteristics of different materials, expanding the absorption range across the solar spectrum. This stacked structure allows each material layer to focus on its optimal absorption spectral range, thereby increasing overall photoconversion efficiency.

In a sixth embodiment of the present invention, an inverted perovskite solar cell with a p-i-n architecture is provided. the inverted perovskite solar cell comprises a hole-transporting layer including the first or the second or the third or the fourth polymer hole-transporting material.

Preferred, the inverted perovskite solar cell cab be either a single-junction solar cell or at least one sub-cell of a multi-junction solar cell.

Preferred, the inverted perovskite solar cell can be arranged as an inverted perovskite sub-cell on a silicon heterojunction sub-cell in a tandem solar cell.

The following examples are provided to illustrate further and to facilitate the understanding of the present teachings and are not in any way intended to limit the invention.

EXAMPLES

Example 1—Synthesis of copolymers CT-1, CT-2, and CT-3

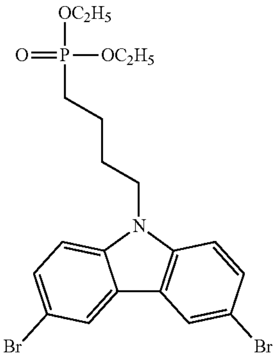

+

-continued

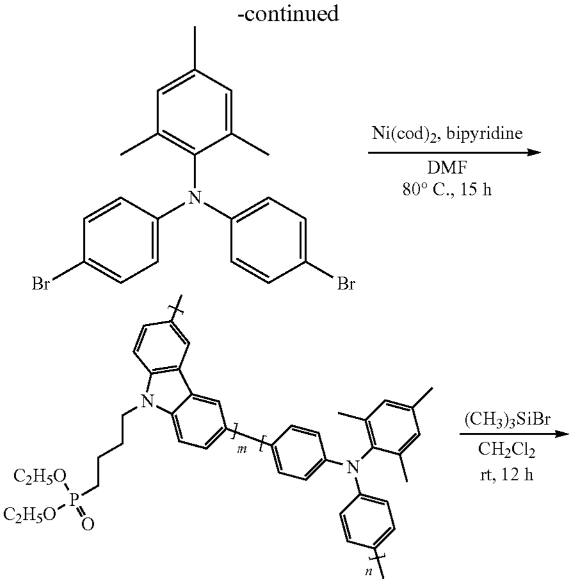

preCT-1 m:n = 1:1
preCT-2 m:n = 1:2
preCT-3 m:n = 1:3

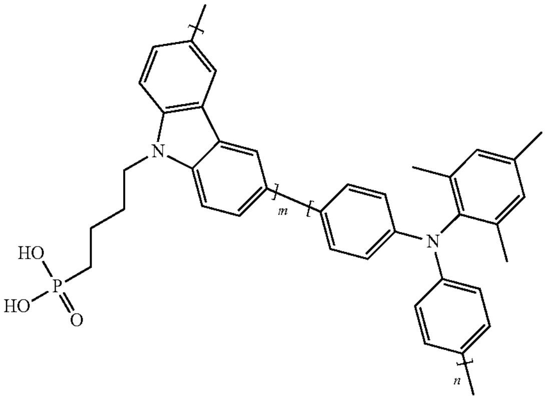

CT-1 m:n = 1:1
CT-2 m:n = 1:2
CT-3 m:n = 1:3 preCT-1: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. Subsequently, the solution of diethyl (4-(3,6-dibromo-9H-carbazol-9-yl)butyl)phosphonate (274 mg, 0.53 mmol, 0.3 equiv.) and N,N-bis(4-bromophenyl)-2,4,6-trimethylaniline (236 mg, 0.53 mmol, 0.3 equiv.) in 6 ml of anhydrous DMF was added dropwise to the reaction mixture. The resulting mixture was kept stirred at 80° C. for 18 h. It was cooled to room temperature and 1 M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 250 mg of preCT-1 as a pale grey solid in a yield of 76%. $^1H$-NMR ($CDCl_3$, 400 MHz) δ

(ppm): 8.40 (s), 7.90 (s), 7.42 (m), 7.09 (m), 6.77 (s), 4.33 (m), 2.22 (m), 1.40 (m), 1.26 (m); SEC data: $M_n$=10.1×10$^3$ g mol$^{-1}$, Đ=2.67.

CT-1: To a solution of preCT-1 (60 mg) in 11 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 50 mg of CT-1 as a white solid in a yield of 91%. $^1$H-NMR ($CDCl_3$ and $CD_3OD$, 400 MHz) δ (ppm): 8.40 (s), 7.90 (m), 7.09 (m), 6.77 (s), 4.90 (m), 4.01 (m), 2.34 (m), 1.26 (m).

preCT-2: The synthetic route of preCT-2 is similar to that of preCT-1, excepting for using the solution of diethyl (4-(3,6-dibromo-9H-carbazol-9-yl)butyl)phosphonate (181 mg, 0.35 mmol, 0.21 equiv.) and N,N-bis(4-bromophenyl)-2,4,6-trimethylaniline (312 mg, 0.70 mmol, 0.42 equiv.) in 6 ml of anhydrous DMF. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 234 mg of preCT-1 as a pale grey solid in a yield of 72%. $^1$H-NMR ($CDCl_3$, 400 MHz) δ (ppm): 8.41 (s), 7.89 (s), 7.42 (m), 7.09 (m), 6.77 (s), 4.33 (m), 2.22 (m), 1.40 (m), 1.26 (m); SEC data: $M_n$=12.1×10$^3$ g mol$^{-1}$, Đ=2.45.

CT-2: The synthetic route of CT-2 is similar to that of CT-1, excepting for using the solution of preCT-2 (60 mg) in 11 mL of anhydrous $CH_2Cl_2$. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 47 mg of CT-2 as a white solid in a yield of 84%. 1H-NMR ($CDCl_3$ and $CD_3OD$, 400 MHz) δ (ppm): 8.43 (s), 7.87 (br, m), 7.12 (m), 6.78 (s), 4.97 (m), 4.01 (m), 2.34 (m), 1.26 (m).

preCT-3: The synthetic route of preCT-3 is similar to that of preCT-3, excepting for using the solution of diethyl (4-(3,6-dibromo-9H-carbazol-9-yl)butyl)phosphonate (140 mg, 0.27 mmol, 0.16 equiv.) and N,N-bis(4-bromophenyl)-2,4,6-trimethylaniline (356 mg, 0.80 mmol, 0.47 equiv.) in 6 ml of anhydrous DMF. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 219 mg of preCT-3 as a pale grey solid in a yield of 67%. $^1$H-NMR ($CDCl_3$, 400 MHz) δ (ppm): 8.40 (s), 7.91 (s), 7.42 (m), 7.10 (m), 6.77 (s), 4.35 (m), 2.29 (m), 1.40 (m), 1.28 (m); SEC data: $M_n$=12.8×10$^3$ g mol$^{-1}$, Đ=2.75.

CT-3: The synthetic route of CT-3 is similar to that of CT-3, excepting for using the solution of preCT-3 (60 mg) in 11 mL of anhydrous $CH_2Cl_2$. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 53 mg of CT-2 as a white solid in a yield of 93%. $^1$H-NMR ($CDCl_3$ and $CD_3OD$, 400 MHz) δ (ppm): 8.44 (s), 7.90 (br, m), 7.12 (m), 6.78 (s), 4.92 (m), 4.05 (m), 2.31 (m), 1.28 (m).

Example 2—Synthesis of Copolymer CP

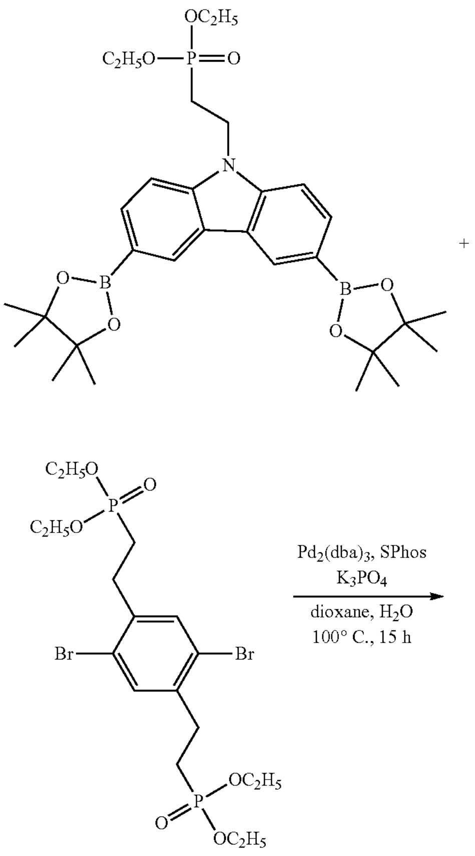

-continued

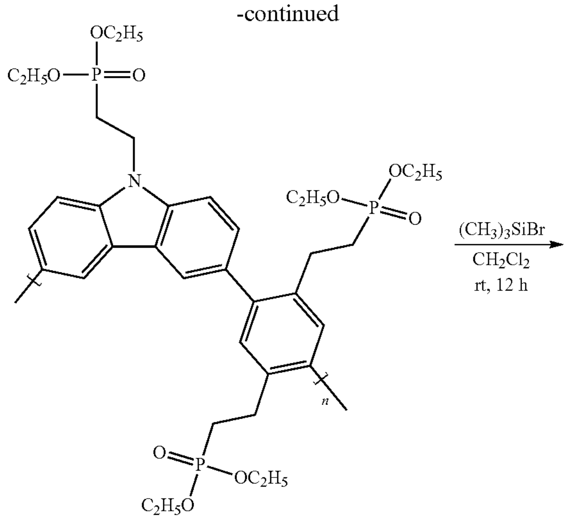

preCP

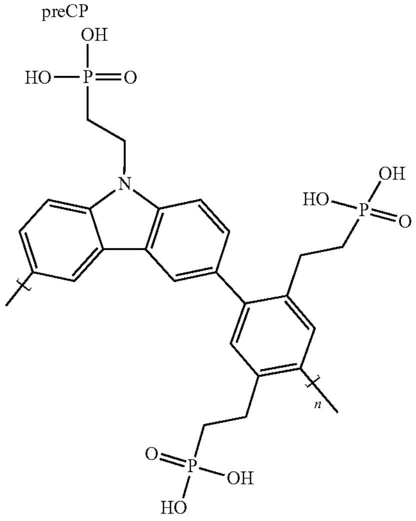

CP preCP: To a mixture of diethyl (2-(3,6-bis(4,4,5,5-tetramethyl-1,3,2-dioxaborolan-2-yl)-9H-carbazol-9-yl)ethyl) phosphonate (292 mg, 0.5 mmol, 1.0 equiv), tetraethyl ((2,5-dibromo-1,4-phenylene)bis(ethane-2,1-diyl))bis(phosphonate) (282 mg, 0.5 mmol, 1.0 equiv.), tris(dibenzylideneacetone)dipalladium(0) (13 mg, 0.014 mmol, 3 mol %), 2-dicyclohexylphosphino-2',6'-dimethoxybiphenyl (SPhos) (25 mg, 0.06 mmol, 12 mol %), and potassium phosphate (425 mg, 2.0 mmol, 4 equiv.) was added 5 mL of dioxane and 2 mL of water under an atmosphere of $N_2$. The resulting mixture was refluxed under the same atmosphere of $N_2$ for 15 hours. The resulting mixture was extracted with $CH_2Cl_2$ and the organic layer dried with anhydrous $MgSO_4$, and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 187 mg of preCP as a grey solid in a yield of 51%. $^1$H-NMR ($CDCl_3$, 400 MHz) δ (ppm): 8.50 (s), 7.67 (m), 7.42 (m), 6.99 (s), 4.30 (m), 2.99 (m), 1.92 (m), 1.28 (m); SEC data: $M_n$=7.8×10$^3$ g mol$^{-1}$, Đ=2.22.

CP: To a solution of preCP (100 mg) in 20 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 74 mg of CP as a grey solid in a yield of 95%. $^1$H-NMR ($CDCl_3$ and $CD_3OD$, 400 MHz) δ (ppm): 8.42 (s), 7.50 (m), 6.90 (m), 5.01 (s), 4.05 (m), 2.89 (m), 2.00 (m).

Example 3—Synthesis of Copolymer CPCN

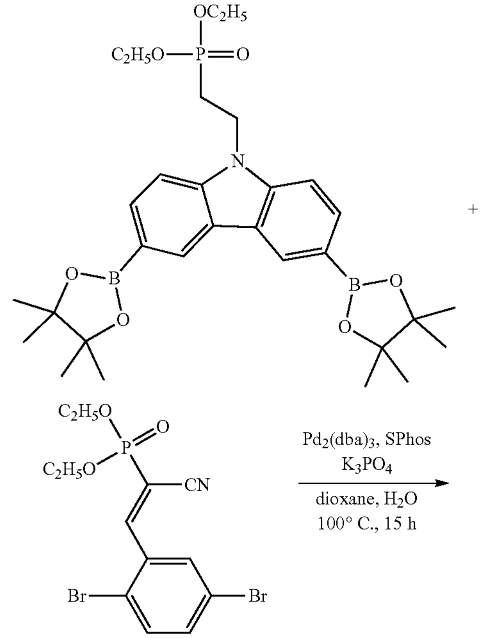

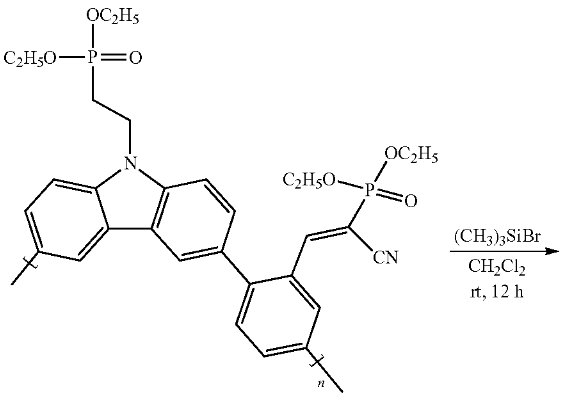

preCPCN

-continued

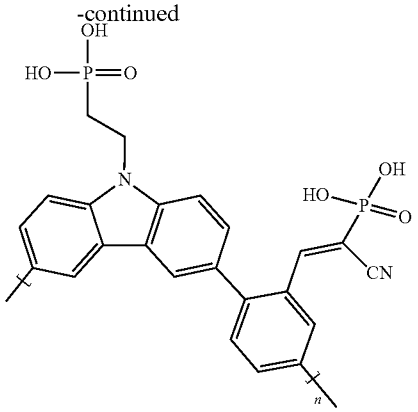

CPCN preCPCN: To a mixture of diethyl (2-(3,6-bis(4,4,5,5-tetramethyl-1,3,2-dioxaborolan-2-yl)-9H-carbazol-9-yl)ethyl)phosphonate (292 mg, 0.5 mmol, 1.0 equiv), diethyl (E)-(1-cyano-2-(2,5-dibromophenyl)vinyl)phosphonate (210 mg, 0.5 mmol, 1.0 equiv.), tris(dibenzylideneacetone)dipalladium(0) (13 mg, 0.014 mmol, 3 mol %), 2-dicyclohexylphosphino-2',6'-dimethoxybiphenyl (SPhos) (25 mg, 0.06 mmol, 12 mol %), and potassium phosphate (425 mg, 2.0 mmol, 4 equiv.) was added 5 mL of dioxane and 2 mL of water under an atmosphere of $N_2$. The resulting mixture was refluxed under the same atmosphere of $N_2$ for 15 hours. The resulting mixture was extracted with $CH_2Cl_2$ and the organic layer dried with anhydrous $MgSO_4$, and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 212 mg of preCPCN as a grey solid in a yield of 71%. $^1$H-NMR ($CDCl_3$, 400 MHz) δ (ppm): 8.38 (s), 8.20 (m), 7.64 (m), 4.28 (m), 2.05 (m), 1.92 (m), 1.32 (m); SEC data: $M_n$=9.2×$10^3$ g $mol^{-1}$, Đ=1.92.

CPCN: To a solution of preCPCN (100 mg) in 20 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 75 mg of CPCN as a grey solid in a yield of 96%. $^1$H-NMR ($CDCl_3$ and $CD_3OD$, 400 MHz) δ (ppm): 8.42 (s), 7.59 (m), 7.00 (m), 5.01 (s), 4.05 (m), 2.85 (m), 2.00 (m).

Example 4—Synthesis of Copolymer CP5CN

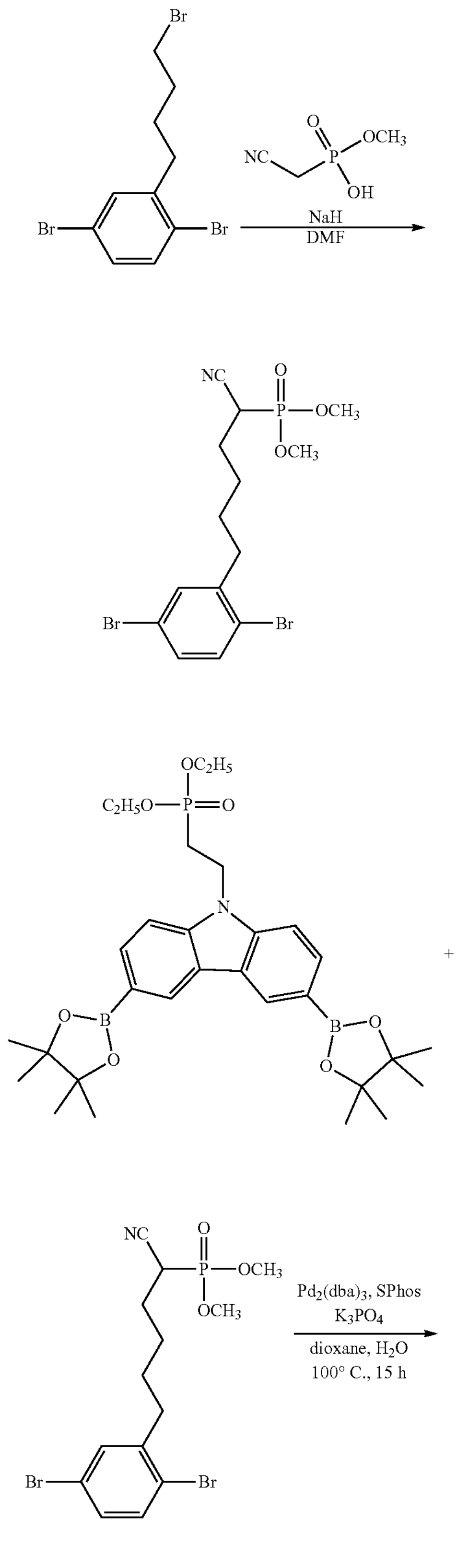

-continued

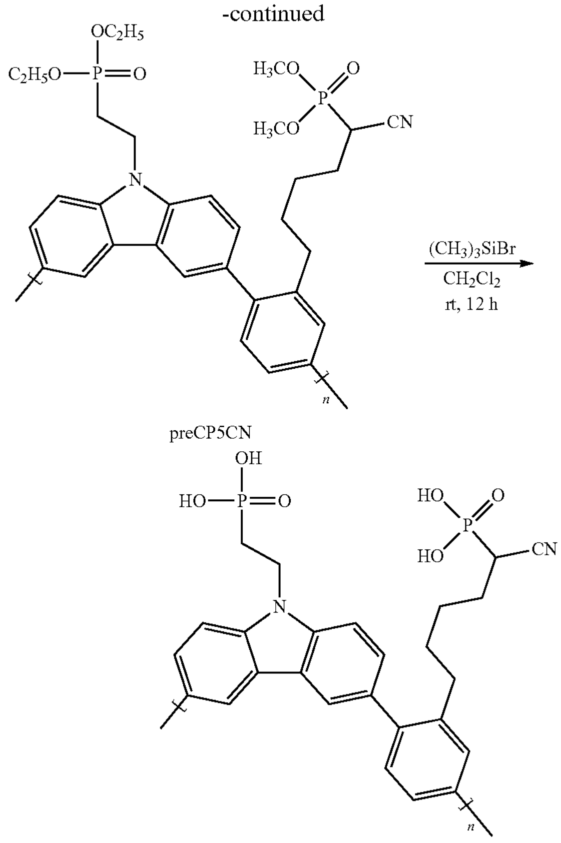

preCP5CN

CP5CN

Dimethyl (1-cyano-2-(2,5-dibromophenyl)butyl)phosphonate: To a suspension of sodium hydride (60% in mineral oil, 220 mg, 5.5 mmol, 1.1 equiv.) in 28 mL of anhydrous DMF was added dimethyl (cyanomethyl)phosphonate (0.9 mL, 5.5 mmol, 1.1 equiv.) at 0° C. under nitrogen atmosphere. The reaction mixture was stirred for 30 minutes. Subsequently, the solution of 1,4-dibromo-2-(4-bromobutyl) benzene (1.85 g, 5.0 mmol, 1.0 equiv.) in 10 ml of anhydrous DMF was added dropwise to the reaction mixture. The reaction mixture was warmed to room temperature and stirred for 12 h and then quenched with water. The resulting mixture was extracted with $CH_2Cl_2$ and the organic layer was washed with brine, dried with anhydrous $MgSO_4$, and concentrated under reduced pressure. The crude product was purified by column chromatography on silica gel with $CH_2Cl_2$ as eluent to afford 2.02 g (4.6 mmol) dimethyl (1-cyano-2-(2,5-dibromophenyl)butyl)phosphonate as a pale yellow oil in a yield of 92%. $^1$H-NMR ($CDCl_3$) δ (ppm): 7.44 (d, J=8.0 Hz, 2H), 7.34 (d, J=8.0 Hz, 2H), 7.22 (s, 2H), 3.70 (s, 6H), 3.82 (s, 6H), 2.60 (m, 2H), 1.86 (m, 2H), 2.40 (m, 1), 1.81 (m, 2H), 1.62 (m, 2H), 1.28 (m, 2H). HRMS (ESI): calcd. for $C_{14}H_{18}Br_2NO_3P$ ([M]$^+$): 436.9391, found: 436.9377.

preCP5CN: To a mixture of diethyl (2-(3,6-bis(4,4,5,5-tetramethyl-1,3,2-dioxaborolan-2-yl)-9H-carbazol-9-yl) ethyl)phosphonate (292 mg, 0.5 mmol, 1.0 equiv), dimethyl (1-cyano-2-(2,5-dibromophenyl)butyl)phosphonate (220 mg, 0.5 mmol, 1.0 equiv.), tris(dibenzylideneacetone)dipalladium(0) (13 mg, 0.014 mmol, 3 mol %), 2-dicyclohexylphosphino-2',6'-dimethoxybiphenyl (SPhos) (25 mg, 0.06 mmol, 12 mol %), and potassium phosphate (425 mg, 2.0 mmol, 4 equiv.) was added 5 mL of dioxane and 2 mL of water under an atmosphere of $N_2$. The resulting mixture was refluxed under the same atmosphere of $N_2$ for 15 hours. The resulting mixture was extracted with $CH_2Cl_2$ and the organic layer dried with anhydrous $MgSO_4$, and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 250 mg of preCP5CN as a grey solid in a yield of 82%. $^1$H-NMR ($CDCl_3$, 400 MHz) δ (ppm): 8.35 (m), 8.20 (m), 7.64 (m), 4.20 (m), 3.71 (m), 2.5 (m), 2.05 (m), 1.92 (m), 1.68 (m), 1.32 (m); SEC data: $M_n$=11.2×$10^3$ g mol$^{-1}$, Đ=2.01.

CP5CN: To a solution of preCP5CN (100 mg) in 20 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 77 mg of CP5CN as a grey solid in a yield of 97%. $^1$H-NMR ($CDCl_3$ and $CD_3OD$, 400 MHz) δ (ppm): 8.42 (m), 7.59 (m), 7.00 (m), 4.10 (m), 2.65 (m), 2.00 (m), 1.28 (m).

Example 5—Synthesis of Copolymers TT-1, TT-2, and TT-3

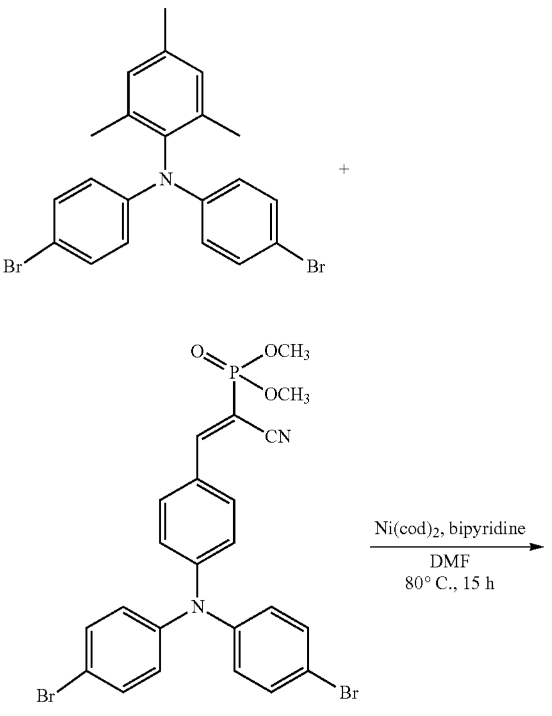

-continued

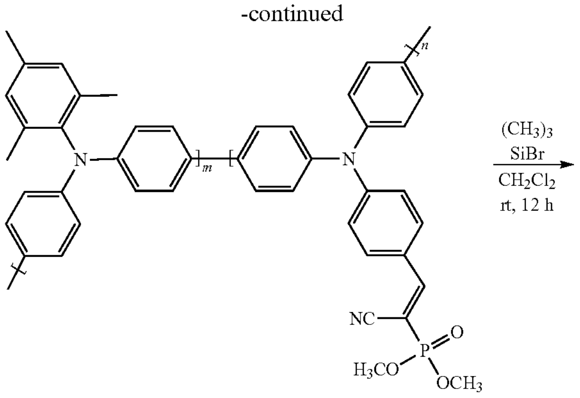

preTT-1 m:n = 1:1
preTT-2 m:n = 1:2
preTT-3 m:n = 1:3

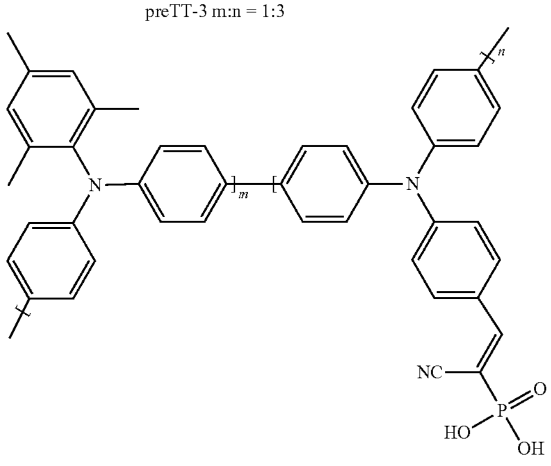

TT-1 m:n = 1:1
TT-2 m:n = 1:2
TT-3 m:n = 1:3 preTT-1: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. Subsequently, the solution of dimethyl (E)-(2-(4-(bis(4-bromophenyl)amino)phenyl)-1-cyanovinyl)phosphonate (286 mg, 0.51 mmol, 0.3 equiv.) and N,N-bis(4-bromophenyl)-2,4,6-trimethylaniline (227 mg, 0.51 mmol, 0.3 equiv.) in 8 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 228 mg of preTT-1 as a yellow solid in a yield of 65%. $^1$H-NMR ($CDCl_3$, 400 MHz) δ (ppm): 7.90 (m), 7.62 (m), 7.19 (s), 6.80 (s), 4.02 (m), 2.22 (m); SEC data: $M_n$=8.2x$10^3$ g $mol^{-1}$, Đ=2.44.

TT-1: To a solution of preTT-1 (100 mg) in 20 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 94 mg of TT-1 as an orange solid in a yield of 98%. $^1$H-NMR ($CDCl_3$ and $CD_3OD$, 400 MHz) δ (ppm): 7.85 (s), 7.57 (m), 6.90 (m), 4.90 (s), 2.60 (m).

preTT-2: The synthetic route of preTT-2 is similar to that of preTT-1, excepting for using the solution of diethyl (4-(3,6-dibromo-9H-carbazol-9-yl)butyl)phosphonate (197 mg, 0.35 mmol, 0.21 equiv.) and N,N-bis(4-bromophenyl)-2,4,6-trimethylaniline (312 mg, 0.70 mmol, 0.42 equiv.) in 8 ml of anhydrous DMF. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 261 mg of preTT-1 as a yellow solid in a yield of 77%. $^1$H-NMR ($CDCl_3$, 400 MHz) δ (ppm): 7.90 (m), 7.62 (m), 7.20 (s), 6.80 (s), 4.02 (m), 2.22 (m); SEC data: $M_n$=9.8x$10^3$ g $mol^{-1}$, Đ=2.45.

TT-2: The synthetic route of TT-2 is similar to that of TT-1, excepting for using the solution of preTT-2 (100 mg) in 20 mL of anhydrous $CH_2Cl_2$. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 94 mg of TT-2 as an orange solid in a yield of 97%. $^1$H-NMR ($CDCl_3$ and $CD_3OD$, 400 MHz) δ (ppm): 7.86 (s), 7.57 (m), 6.90 (m), 4.90 (s), 2.60 (m).

preTT-3: The synthetic route of preTT-3 is similar to that of preTT-3, excepting for using the solution of diethyl (4-(3,6-dibromo-9H-carbazol-9-yl)butyl)phosphonate (151 mg, 0.27 mmol, 0.16 equiv.) and N,N-bis(4-bromophenyl)-2,4,6-trimethylaniline (356 mg, 0.80 mmol, 0.47 equiv.) in 6 ml of anhydrous DMF. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 244 mg of preTT-3 as a yellow solid in a yield of 72%. $^1$H-NMR ($CDCl_3$, 400 MHz) δ (ppm): 7.90 (m), 7.62 (m), 7.20 (s), 6.80 (s), 4.02 (m), 2.22 (m); SEC data: $M_n$=10.2x$10^3$ g $mol^{-1}$, Đ=2.77.

TT-3: The synthetic route of TT-3 is similar to that of TT-1, excepting for using the solution of preTT-3 (100 mg) in 20 mL of anhydrous $CH_2Cl_2$. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 91 mg of TT-3 as an orange solid in a yield of 93%. $^1$H-NMR ($CDCl_3$ and $CD_3OD$, 400 MHz) δ (ppm): 7.86 (s), 7.60 (m), 6.92 (m), 4.90 (s), 2.60 (m).

Example 6—Synthesis of Copolymer CC-1

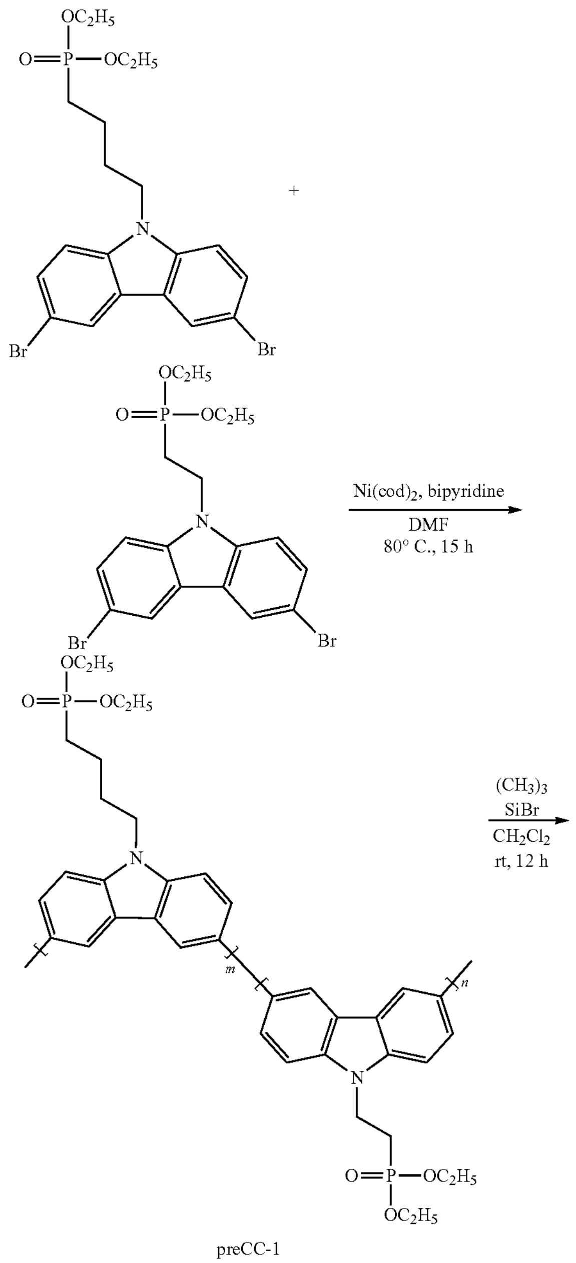

preCC-1

-continued

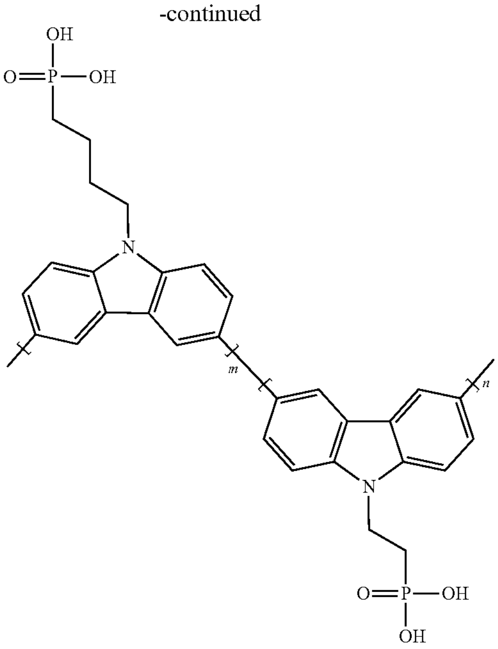

CC-1 preCC-1: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. Subsequently, the solution of diethyl (4-(3,6-dibromo-9H-carbazol-9-yl)butyl)phosphonate (264 mg, 0.51 mmol, 0.3 equiv.) and diethyl (2-(3,6-dibromo-9H-carbazol-9-yl)ethyl)phosphonate (249 mg, 0.51 mmol, 0.3 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 193 mg (60%) of preCC-1 as a grey solid in a yield of 55%. $^1$H-NMR ($CDCl_3$, 400 MHz) δ (ppm): 8.78 (m), 7.80 (m), 4.10 (m), 4.02 (m), 2.00 (m), 1.28 (m); SEC data: $M_n$=13.2×$10^3$ g $mol^{-1}$, Đ=1.98.

CC-1: To a solution of preCC-1 (120 mg) in 10 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 85 mg of CC-1 as a white solid in a yield of 85%. 1H-NMR ($CDCl_3$ and $CD_3OD$, 400 MHz) δ (ppm): 8.78 (m), 7.80 (m), 4.92 (m), 4.00 (s), 1.98 (m), 1.29 (m).

Example 7—Synthesis of 5-PACz-CN

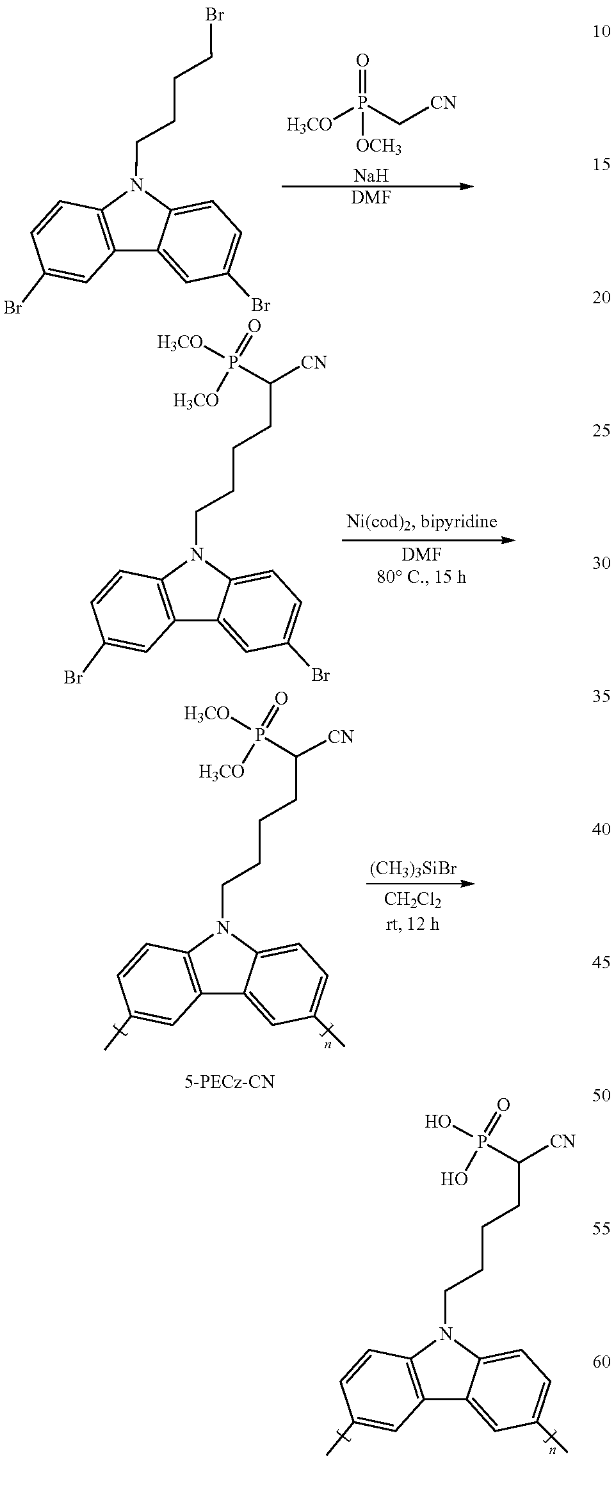

5-PECz-CN

5-PACz-CN

Dimethyl (1-cyano-5-(3,6-dibromo-9H-carbazol-9-yl) pentyl)phosphonate: To a suspension of sodium hydride (60% in mineral oil, 220 mg, 5.5 mmol, 1.1 equiv.) in 28 mL of anhydrous DMF was added dimethyl (cyanomethyl) phosphonate (0.9 mL, 5.5 mmol, 1.1 equiv.) at 0° C. under nitrogen atmosphere. The reaction mixture was stirred for 30 minutes. Subsequently, the solution of 3,6-dibromo-9-(4-bromobutyl)-9H-carbazole (2.30 g, 5.0 mmol, 1.0 equiv.) in 10 ml of anhydrous DMF was added dropwise to the reaction mixture. The reaction mixture was warmed to room temperature and stirred for 12 h and then quenched with water. The resulting mixture was extracted with $CH_2Cl_2$ and the organic layer was washed with brine, dried with anhydrous $MgSO_4$, and concentrated under reduced pressure. The crude product was purified by column chromatography on silica gel with $CH_2Cl_2$ as eluent to afford 1.85 g (3.5 mmol) of dimethyl (1-cyano-5-(3,6-dibromo-9H-carbazol-9-yl)pentyl)phosphonate as a blue solid in a yield of 70%. $^1$H-NMR ($CDCl_3$) δ (ppm): 8.00 (s, 2H), 7.46 (d, J=8.0 Hz, 2H), 7.29 (d, J=8.0 Hz, 2H), 4.22 (t, J=8.0 Hz, 2H), 3.82 (s, 6H), 2.44 (m, 1H), 1.86 (m, 2H), 1.50 (m, 2H), 1.28 (m, 2H). $^{13}$C-NMR ($CDCl_3$) δ (ppm): 134.0, 126.1, 124.7, 123.5, 122.7, 117.2, 117.2, 58.2, 52.1, 31.9, 28.2, 25.9, 14.1. HRMS (ESI): calcd. for $C_{20}H_{21}Br_2N_2O_3P$ ($[M]^+$): 525.9657, found: 525.9633.

5-PECz-CN: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. Subsequently, dimethyl (1-cyano-5-(3,6-dibromo-9H-carbazol-9-yl)pentyl)phosphonate (560 mg, 1.06 mmol, 0.62 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 195 mg of 5-PECz-CN as a grey solid in a yield of 50%. $^1$H-NMR ($CDCl_3$, 400 MHz) δ (ppm): 7.88 (m), 7.52 (m), 4.10 (m), 3.67 (m), 2.48 (s), 1.88 (m), 1.60 (m), 1.30 (m); SEC data: $M_n=12.2\times10^3$ g $mol^{-1}$, Đ=2.02.

5-PACz-CN: To a solution of 5-PECz-CN (100 mg) in 18 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 83 mg of 5-PACz-CN as a white solid in a yield of 90%. $^1$H-NMR ($CDCl_3$ and $CD_3OD$, 400 MHz) δ (ppm): 7.78 (m), 7.42 (m), 4.88 (m), 4.22 (s), 2.42 (s), 1.88 (m), 1.60 (m), 1.30 (m).

Example 8—Synthesis of 2-PACz-m

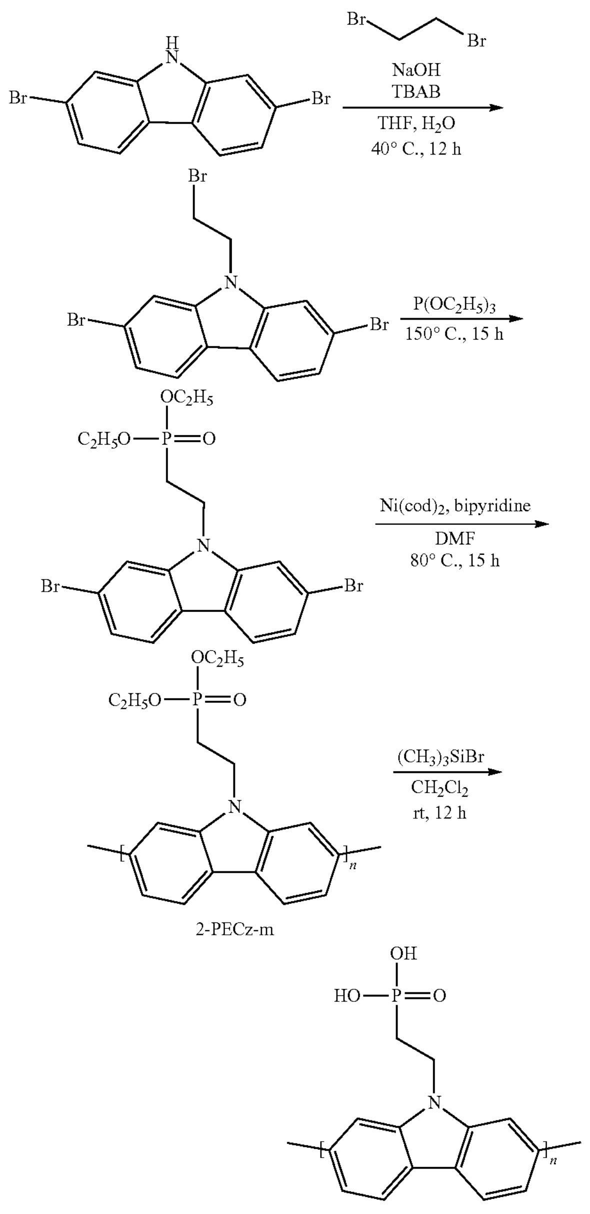

2-PECz-m

2-PACz-m 2,7-dibromo-9-(2-bromoethyl)-9H-carbazole: To a mixture of 2,7-dibromo-9H-carbazole (3.25 g, 10 mmol, 1.0 equiv.), 1,2-dibromoethane (1.3 mL, 15 mmol, 1.5 equiv.), sodium hydroxide (1.6 g, 40 mmol, 4.0 equiv.), and tetrabutylammonium bromide (0.97 g, 3 mmol, 30 mol %) was added 50 mL of THE and 20 mL of water. The reaction mixture was stirred at 40° C. for 12 h. The resulting mixture was extracted with ethyl acetate and the organic layer was washed with brine, dried with anhydrous $MgSO_4$, and concentrated under reduced pressure. The crude product was purified by column chromatography on silica gel with hexane/$CH_2Cl_2$ 4/1 (v/v) as eluent to afford 3.9 g (9 mmol) of 2,7-dibromo-9-(2-bromoethyl)-9H-carbazole as a white solid in a yield of 90%. $^1$H-NMR ($CDCl_3$, 400 MHz) δ (ppm): 8.62 (s, 2H), 8.23 (d, J=8.0 Hz, 2H), 7.29 (d, J=8.0

Hz, 2H), 4.35 (t, J=8.0 Hz, 2H), 3.62 (t, J=8.0 Hz, 2H. $^{13}$C-NMR ($CDCl_3$, 100 MHz) δ (ppm): 131.9, 126.2, 123.1, 117.9, 114.2, 112.2, 62.2, 31.9. HRMS (ESI): calcd. for $C_{14}H_{10}Br_3N$ ([M]$^+$): 428.8363, found: 428.8300.

Diethyl (2-(2,7-dibromo-9H-carbazol-9-yl)ethyl)phosphonate: To 2,7-dibromo-9-(2-bromoethyl)-9H-carbazole (500 mg, 1.16 mmol) was added 5 mL of triethyl phosphite under nitrogen atmosphere. The reaction mixture was stirred at 150° C. for 15 h. The resulting mixture was concentrated under reduced pressure and purified by column chromatography on silica gel with ethyl acetate as eluent to afford 498 mg (1.02 mmol) of diethyl (2-(2,7-dibromo-9H-carbazol-9-yl)ethyl)phosphonate as a pale yellow oil in a yield of 88%. $^1$H-NMR ($CDCl_3$, 400 MHz) δ (ppm): 8.61 (s, 2H), 8.13 (d, J=8.0 Hz, 2H), 7.22 (d, J=8.0 Hz, 2H), 4.20 (m, 4H), 4.10 (t, J=8.0 Hz, 2H), 2.00 (m, 2H), 1.36 (m, 6H). $^{13}$C-NMR ($CDCl_3$, 100 MHz) δ (ppm): 131.9, 126.3, 123.2, 117.9, 114.2, 112.2, 62.9, 44.1, 31.2, 16.1. HRMS (ESI): calcd. for $C_{18}H_{20}Br_2NO_3P$ ([M]$^+$): 486.9548, found: 486.9542.

2-PECz-m: To a mixture of Ni(COD)$_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. The reaction mixture was stirred at 80° C. for 60 minutes. Subsequently, diethyl (2-(2,7-dibromo-9H-carbazol-9-yl)ethyl)phosphonate (498 mg, 1.02 mmol, 0.6 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 202 mg of 2-PECz-m as a grey solid in a yield of 58%. $^1$H-NMR ($CDCl_3$, 400 MHz) δ (ppm): 8.22 (m), 7.85 (m), 7.66 (m), 4.23 (m), 2.00 (m), 1.30 (m); SEC data: Mo=12.8x10$^3$ g mol$^{-1}$, Đ=2.11.

2-PACz-m: To a solution of 2-PECz-m (100 mg) in 15 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 75 mg of 2-PACz-m as a white solid in a yield of 90%. $^1$H-NMR ($CDCl_3$ and $CD_3OD$, 400 MHz) δ (ppm): 8.22 (m), 7.80 (m), 7.60 (m), 4.80 (m), 4.12 (m), 2.00 (m).

Example 9—Synthesis of Homopolymer 4-PAOCz

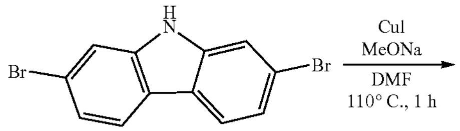

-continued

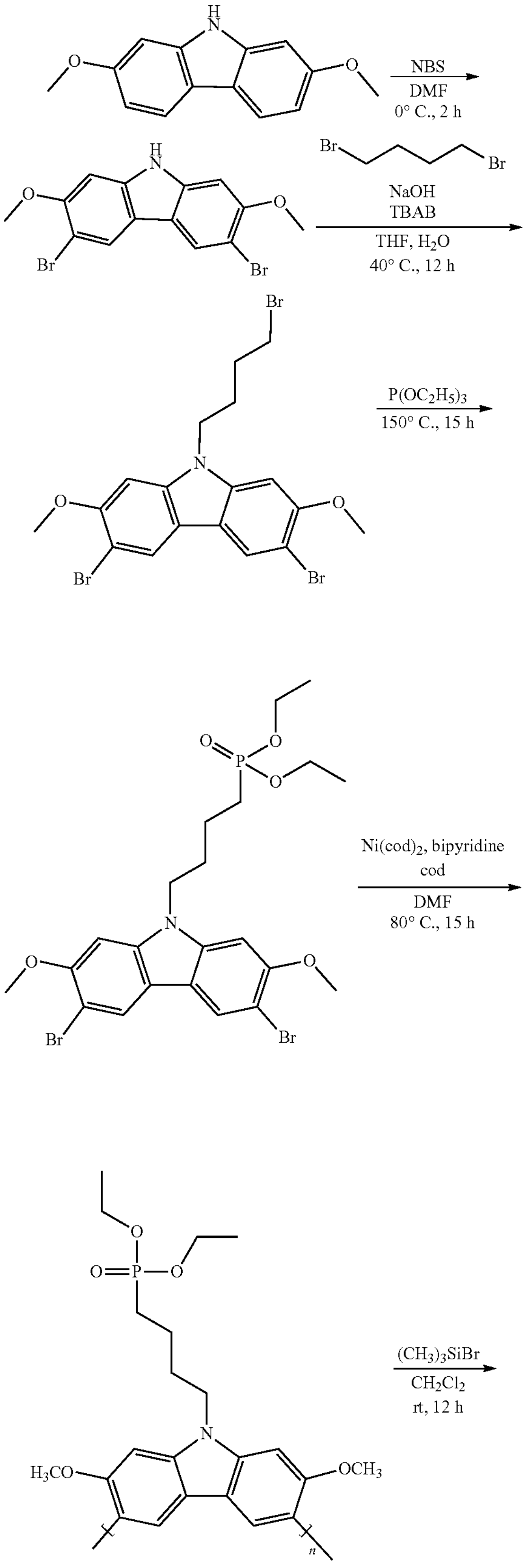

4-PEOCz

-continued

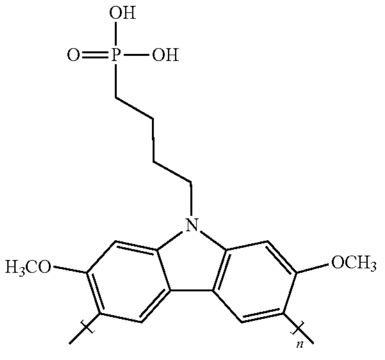

4-PAOCz 2,7-dimethoxy-9H-carbazole: To a solution of 2,7-dibromo-9H-carbazole (3.25 g, 10 mmol, 1 equiv.) and sodium methoxide (5.6 mL, 5.4M in methanol, 30 mmol, 3 equiv.) in 12 mL anhydrous DMF was added copper(I) iodide (380.9 mg, 2 mmol, 20 mol %) at room temperature. The reaction mixture was stirred at 110° C. for 60 minutes. It was cooled to room temperature and then quenched with water. The resulting mixture was extracted with $CH_2Cl_2$ and the organic layer was washed with brine, dried with anhydrous $MgSO_4$, and concentrated under reduced pressure. The crude product was purified by column chromatography on silica gel with $CH_2Cl_2$ as eluent to afford 1.82 g (8 mmol) of 2,7-dimethoxy-9H-carbazole as a white solid in a yield of 80%. $^1$H-NMR ($CDCl_3$, 400 MHz) δ (ppm): 10.1 (s, 1H), 7.63 (d, J=8.0 Hz, 2H), 7.12 (d, J=8.0 Hz, 2H), 7.02 (s, 2H), 3.87 (s, 6H). $^{13}$C-NMR ($CDCl_3$, 100 MHz) δ (ppm): 156.7, 136.5, 128.3, 121.7, 109.2, 95.0, 55.3. HRMS (ESI): calcd. for $C_{22}H_{24}Br_2N_2$ ($[M]^+$): 227.0946, found: 227.0983.

3,6-dibromo-2,7-dimethoxy-9H-carbazole: To a solution of 2,7-dimethoxy-9H-carbazole (2.27 g, 10 mmol, 1 equiv.) in 15 mL anhydrous DMF was added a solution of N-bromosuccinimide (3.56 g, 20 mmol, 2 equiv.) in 15 mL anhydrous DMF with ice bath. The reaction mixture was stirred at 0° C. for 2 hours. It was warmed to room temperature and then quenched with water. The resulting mixture was extracted with $CH_2Cl_2$ and the organic layer was washed with brine, dried with anhydrous $MgSO_4$, and concentrated under reduced pressure. The crude product was purified by column chromatography on silica gel with $CH_2Cl_2$ as eluent to afford 3.47 g (9 mmol) of 3,6-dibromo-2,7-dimethoxy-9H-carbazole as a white solid in a yield of 90%. $^1$H-NMR ($CDCl_3$, 400 MHz) δ (ppm): 10.1 (s, 1H), 8.07 (s, 2H), 6.90 (s, 2H), 4.00 (s, 6H). $^{13}$C-NMR ($CDCl_3$, 100 MHz) δ (ppm): 149.7, 136.3, 122.3, 108.2, 106.3, 97.0, 55.3. HRMS (ESI): calcd. for $C_{22}H_{24}Br_2N_2$ ($[M]^+$): 384.9136, found: 385.0054.

3,6-dibromo-9-(4-bromobutyl)-2,7-dimethoxy-9H-carbazole: To a mixture of 3,6-dibromo-2,7-dimethoxy-9H-carbazole (3.85 g, 10 mmol, 1.0 equiv.), 1,2-dibromobutane (1.8 mL, 15 mmol, 1.5 equiv.), sodium hydroxide (1.6 g, 40 mmol, 4.0 equiv.), and tetrabutylammonium bromide (0.97 g, 3 mmol, 30 mol %) was added 50 mL of THE and 20 mL of water. The reaction mixture was stirred at 40° C. for 12 h. The resulting mixture was extracted with $CH_2Cl_2$ and the organic layer was washed with brine, dried with anhydrous $MgSO_4$, and concentrated under reduced pressure. The crude product was purified by column chromatography on silica gel with hexane/$CH_2Cl_2$ 4/1 (v/v) as eluent to afford 4.68 g (9 mmol) of 3,6-dibromo-9-(4-bromobutyl)-2,7-dimethoxy-9H-carbazole as a white solid in a yield of 90%. $^{1}H$-NMR ($CDCl_3$, 400 MHz) δ (ppm): 7.53 (s, 2H), 6.80 (s, 2H), 4.18 (m, 2H), 4.00 (s, 6H), 3.42 (m, 2H), 1.84 (m, 2H), 1.74 (m, 2H). $^{13}C$-NMR ($CDCl_3$, 100 MHz) δ (ppm): 149.5, 130.3, 122.0, 113.3, 108.2, 97.4, 55.1, 57.3, 33.4, 30.2, 28.8. HRMS (ESI): calcd. for $C_{22}H_{24}Br_2N_2$ ($[M]^+$): 518.8867, found: 518.8904.

Diethyl (4-(3,6-dibromo-2,7-dimethoxy-9H-carbazol-9-yl)butyl)phosphonate: To 3,6-dibromo-9-(4-bromobutyl)-2,7-dimethoxy-9H-carbazole (603 mg, 1.16 mmol) was added 5 mL of triethyl phosphite under nitrogen atmosphere. The reaction mixture was stirred at 150° C. for 15 h. The resulting mixture was concentrated under reduced pressure and purified by column chromatography on silica gel with ethyl acetate as eluent to afford 536 mg (0.93 mmol) of diethyl (4-(3,6-dibromo-2,7-dimethoxy-9H-carbazol-9-yl)butyl)phosphonate as a pale yellow oil in a yield of 80%. $^{1}H$-NMR ($CDCl_3$, 400 MHz) δ (ppm): 7.52 (s, 2H), 6.79 (s, 2H), 4.18 (m, 6H), 4.00 (s, 6H), 1.76 (m, 4H), 1.36 (m, 6H), 1.25 (m, 2H). $^{13}C$-NMR ($CDCl_3$, 100 MHz) δ (ppm): 149.8, 130.5, 122.3, 108.0, 97.4, 62.4, 58.0, 55.3, 31.8, 31.6, 16.3, 12.8. HRMS (ESI): calcd. for $C_{22}H_{24}Br_2N_2$ ($[M]^+$): 577.0051, found: 577.0072.

4-PEOCz: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. The reaction mixture was stirred at 80° C. for 60 minutes. Subsequently, diethyl (4-(3,6-dibromo-2,7-dimethoxy-9H-carbazol-9-yl)butyl)phosphonate (589 mg, 1.02 mmol, 0.6 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 255 mg of 4-PEOCz as a grey solid in a yield of 60%. $^{1}H$-NMR ($CDCl_3$, 400 MHz) δ (ppm): 7.36 (m), 6.90 (m), 4.21 (m), 3.79 (m), 1.80 (m), 1.40 (m); SEC data: $M_n$=7.2x$10^3$ g $mol^{-1}$, Đ=2.35.

4-PAOCz: To a solution of 4-PEOCz (100 mg) in 15 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 78 mg of 4-PAOCz as a grey solid in a yield of 90%. $^{1}H$-NMR ($CDCl_3$ and $CD_3OD$, 400 MHz) δ (ppm): 7.38 (m), 6.85 (m), 4.18 (m), 3.87 (m), 1.75 (m), 1.66 (m), 1.30 (m).

Example 10—Synthesis of Homopolymer 4-PAOCz-m

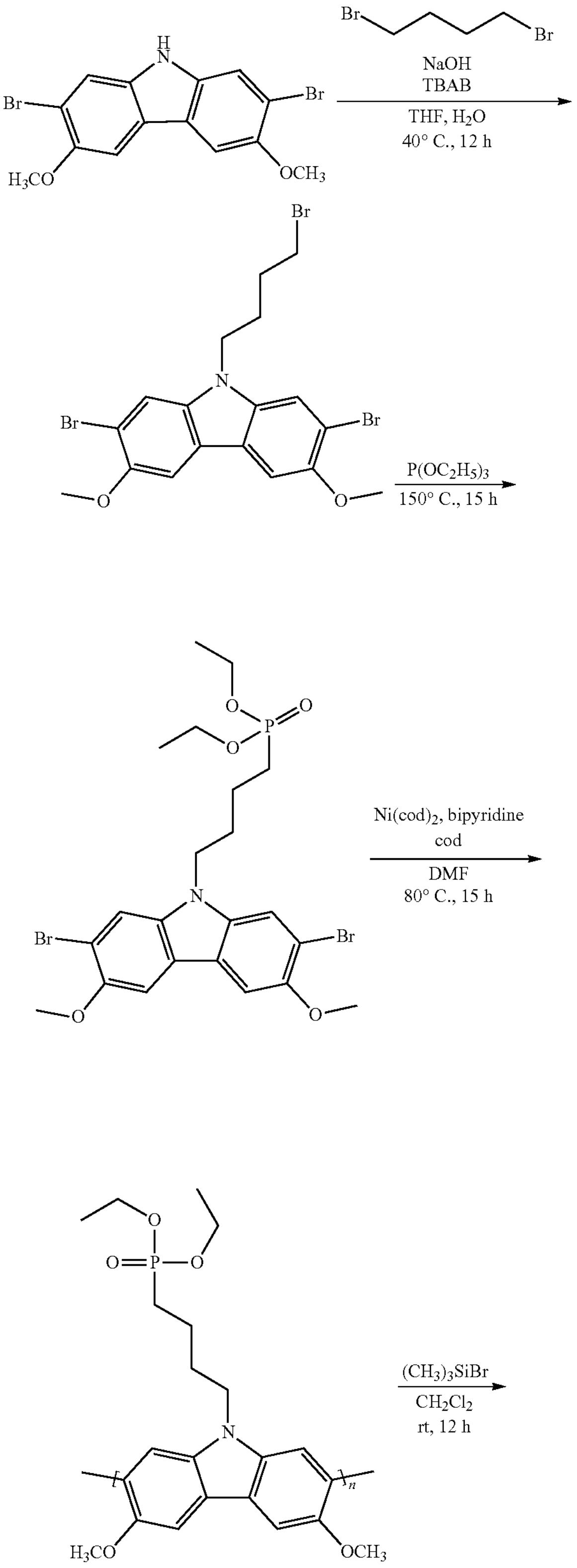

4-PEOCz-m

-continued

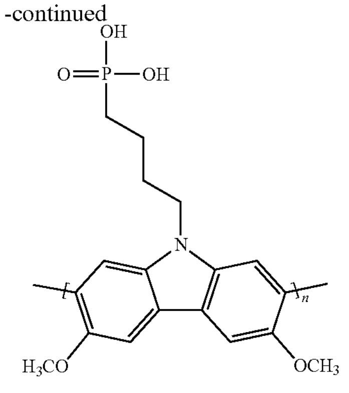

4-PAOCz-m 2,7-dibromo-9-(4-bromobutyl)-3,6-dimethoxy-9H-carbazole: To a mixture of 2,7-dibromo-3,6-dimethoxy-9H-carbazole (3.85 g, 10 mmol, 1.0 equiv.), 1,2-dibromobutane (1.8 mL, 15 mmol, 1.5 equiv.), sodium hydroxide (1.6 g, 40 mmol, 4.0 equiv.), and tetrabutylammonium bromide (0.97 g, 3 mmol, 30 mol %) was added 50 mL of THE and 20 mL of water. The reaction mixture was stirred at 40° C. for 12 h. The resulting mixture was extracted with $CH_2Cl_2$ and the organic layer was washed with brine, dried with anhydrous $MgSO_4$, and concentrated under reduced pressure. The crude product was purified by column chromatography on silica gel with hexane/$CH_2Cl_2$ 4/1 (v/v) as eluent to afford 4.68 g (9 mmol) of 2,7-dibromo-9-(4-bromobutyl)-3,6-dimethoxy-9H-carbazole as a white solid in a yield of 90%. $^1$H-NMR ($CDCl_3$, 400 MHz) δ (ppm): 7.63 (s, 2H), 7.41 (s, 2H), 4.16 (m, 2H), 4.68 (s, 6H), 3.44 (m, 2H), 1.82 (m, 2H), 1.76 (m, 2H). $^{13}$C-NMR ($CDCl_3$, 100 MHz) δ (ppm): 151.6, 128.0, 115.3, 109.2, 106.5, 104.8, 57.8, 55.2, 30.5, 28.6. HRMS (ESI): calcd. for $C_{22}H_{24}Br_2N_2$ ($[M]^+$): 518.8867, found: 518.8893.

Diethyl (4-(2,7-dibromo-3,6-dimethoxy-9H-carbazol-9-yl)butyl)phosphonate: To 2,7-dibromo-9-(4-bromobutyl)-3,6-dimethoxy-9H-carbazole (603 mg, 1.16 mmol) was added 5 mL of triethyl phosphite under nitrogen atmosphere. The reaction mixture was stirred at 150° C. for 15 h. The resulting mixture was concentrated under reduced pressure and purified by column chromatography on silica gel with ethyl acetate as eluent to afford 536 mg (0.93 mmol) of diethyl (4-(2,7-dibromo-3,6-dimethoxy-9H-carbazol-9-yl)butyl)phosphonate as a pale yellow oil in a yield of 80%. $^1$H-NMR ($CDCl_3$, 400 MHz) δ (ppm): 7.48 (s, 2H), 7.37 (s, 2H), 4.18 (m, 6H), 3.68 (s, 6H), 1.74 (m, 4H), 1.38 (m, 6H), 1.24 (m, 2H). $^{13}$C-NMR ($CDCl_3$, 100 MHz) δ (ppm): 151.8, 128.3, 115.7, 109.6, 106.3, 104.1, 62.8, 58.0, 55.7, 31.5, 31.0, 16.8, 12.5. HRMS (ESI): calcd. for $C_{22}H_{24}Br_2N_2$ ($[M]^+$): 577.0051, found: 577.0109.

4-PEOCz-m: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. The reaction mixture was stirred at 80° C. for 60 minutes. Subsequently, diethyl (4-(2,7-dibromo-3,6-dimethoxy-9H-carbazol-9-yl)butyl)phosphonate (589 mg, 1.02 mmol, 0.6 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 255 mg of 4-PEOCz-m as a grey solid in a yield of 60%. $^1$H-NMR ($CDCl_3$, 400 MHz) δ (ppm): 7.76 (m), 7.29 (m), 4.19 (m), 3.82 (m), 1.76 (m), 1.35 (m); SEC data: $M_n$=8.9×10$^3$ g mol$^{-1}$, Đ=2.68.

4-PAOCz-m: To a solution of 4-PEOCz-m (100 mg) in 15 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 78 mg of 4-PAOCz-m as a grey solid in a yield of 90%. $^1$H-NMR ($CDCl_3$ and $CD_3OD$, 400 MHz) δ (ppm): 7.56 (m), 7.28 (m), 4.14 (m), 3.80 (m), 1.75 (m), 1.63 (m), 1.28 (m).

Example 11—Synthesis of Homopolymer 4-PAAd

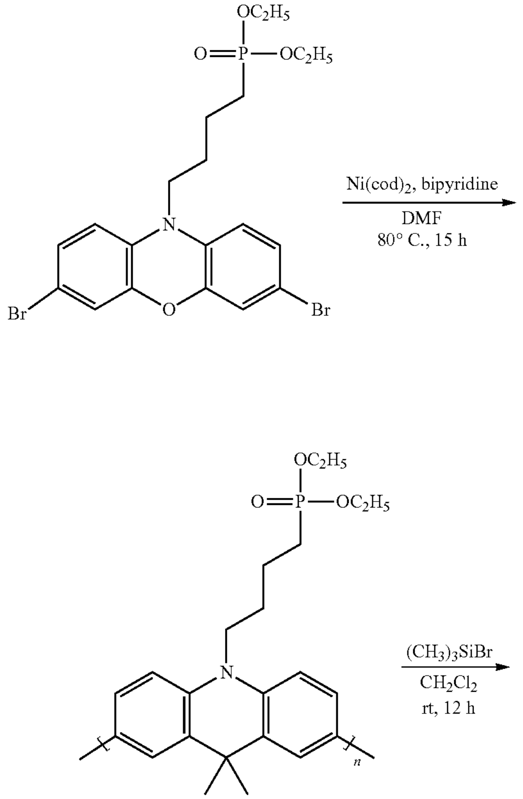

4-PEAd

-continued

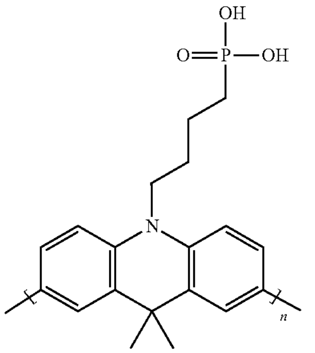

4-PAAd

4-PEAd: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. Subsequently, diethyl (4-(2,7-dibromo-9,9-dimethylacridin-10(9H)-yl)butyl)phosphonate (593 mg, 1.06 mmol, 0.62 equiv.) in 10 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 190 mg of 4-PEAd as a white solid in a yield of 45%. $^1$H-NMR ($CDCl_3$, 400 MHz) δ (ppm): 7.12 (m), 4.20 (m), 4.00 (m), 1.80 (m), 1.51 (m); SEC data: $M_n$=8.6x$10^3$ g $mol^{-1}$, Đ=2.25.

4-PAAd: To a solution of 4-PEAd (60 mg) in 15 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 44 mg of 4-PAAd as a white solid in a yield of 85%. $^1$H-NMR ($CDCl_3$ and $CD_3OD$, 400 MHz) δ (ppm): 7.12 (m), 4.80 (m), 4.01 (m), 1.60 (m).

Example 12—Synthesis of Homopolymer 4-PAPOZ

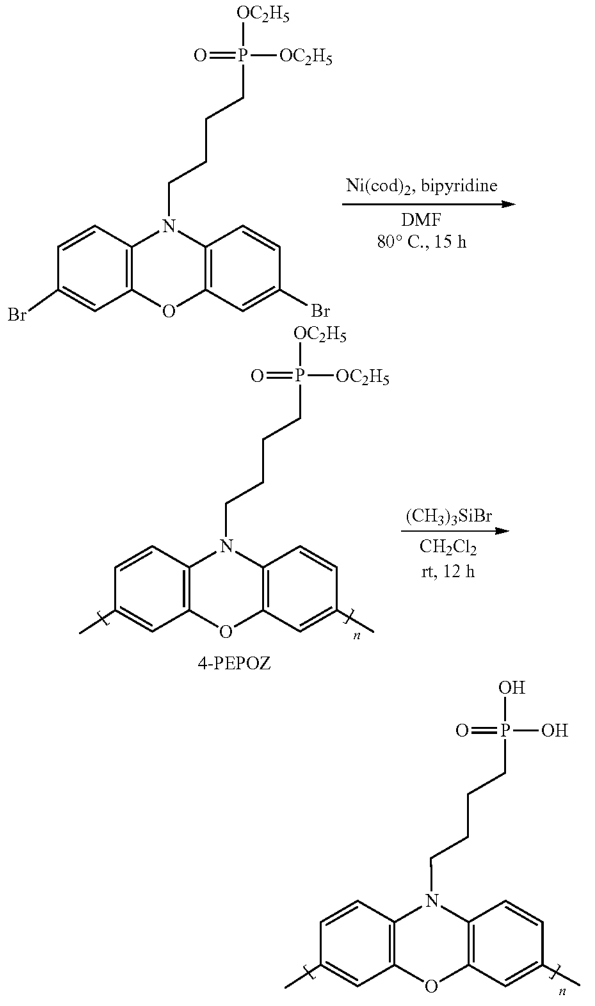

4-PEPOZ

4-PAPOZ

4-PEPOZ: The synthetic route of 4-PEPOZ is similar to that of 4-PEAd, excepting for using diethyl (4-(3,7-dibromo-10H-phenoxazin-10-yl)butyl)phosphonate (565 mg, 1.06 mmol) to replace diethyl (4-(2,7-dibromo-9,9-dimethylacridin-10(9H)-yl)butyl)phosphonate. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 154 mg of 4-PEPOZ as a grey solid in a yield of 39%. $^1$H-NMR ($CDCl_3$, 400 MHz) δ (ppm): 7.08 (m), 4.20 (m), 3.95 (m), 1.80 (m), 1.51 (m); SEC data: $M_n$=6.8x$10^3$ g $mol^{-1}$, Đ=1.88.

4-PAPOZ: The synthetic route of 4-PAPOZ is similar to that of 4-PAAd, excepting for using 60 mg of 4-PEPOZ. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 44 mg of 4-PAPOZ as a white solid in a yield of 86%. $^1$H-NMR ($CDCl_3$ and $CD_3OD$, 400 MHz) δ (ppm): 7.02 (m), 4.81 (m), 3.99 (m), 1.66 (m).

Example 13—Synthesis of Homopolymer 4-PAPTZ

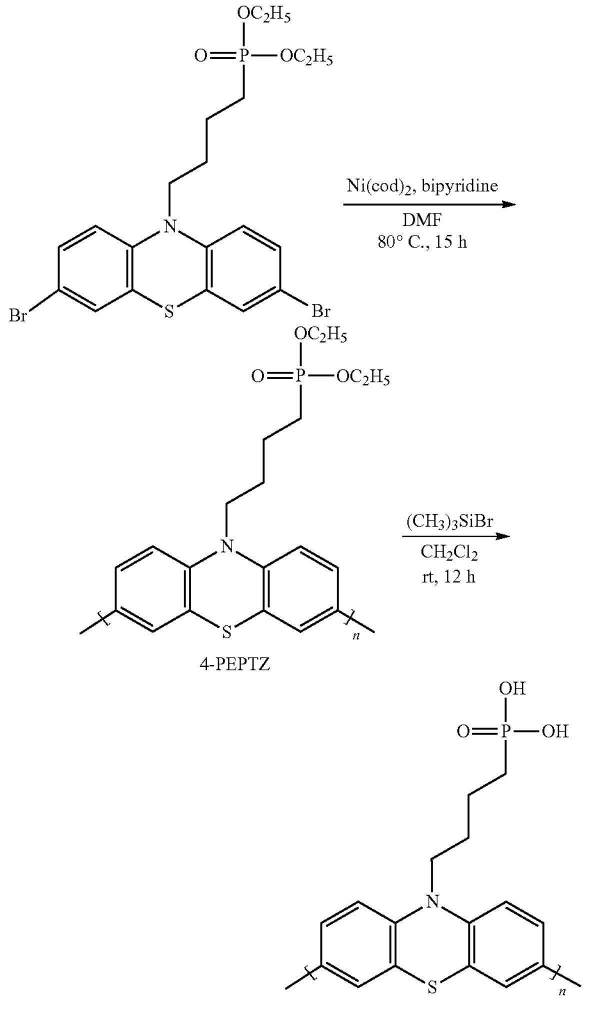

4-PEPTZ

4-PAPTZ

4-PEPTZ: The synthetic route of 4-PEPTZ is similar to that of 4-PEAd, excepting for using diethyl (4-(3,7-di-bromo-1 OH-phenothiazin-10-yl)butyl)phosphonate (582 mg, 1.06 mmol) to replace diethyl (4-(2,7-dibromo-9,9-dimethylacridin-10(9H)-yl)butyl)phosphonate. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 194 mg of 4-PEPOZ as a white solid in a yield of 47%. $^1$H-NMR ($CDCl_3$, 400 MHz) δ (ppm): 7.15 (m), 4.20 (m), 3.98 (m), 1.80 (m), 1.51 (m); SEC data: $M_n$=9.8×$10^3$ g $mol^{-1}$, Đ=2.32.

4-PAPTZ: The synthetic route of 4-PAPTZ is similar to that of 4-PAAd, excepting for using 60 mg of 4-PEPTZ. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 46 mg of 4-PAPTZ as a white solid in a yield of 90%. $^1$H-NMR ($CDCl_3$ and $CD_3OD$, 400 MHz) δ (ppm): 7.18 (m), 4.81 (m), 3.99 (m), 1.66 (m).

Example 14—Synthesis of Homopolymer 4-PAPSZ

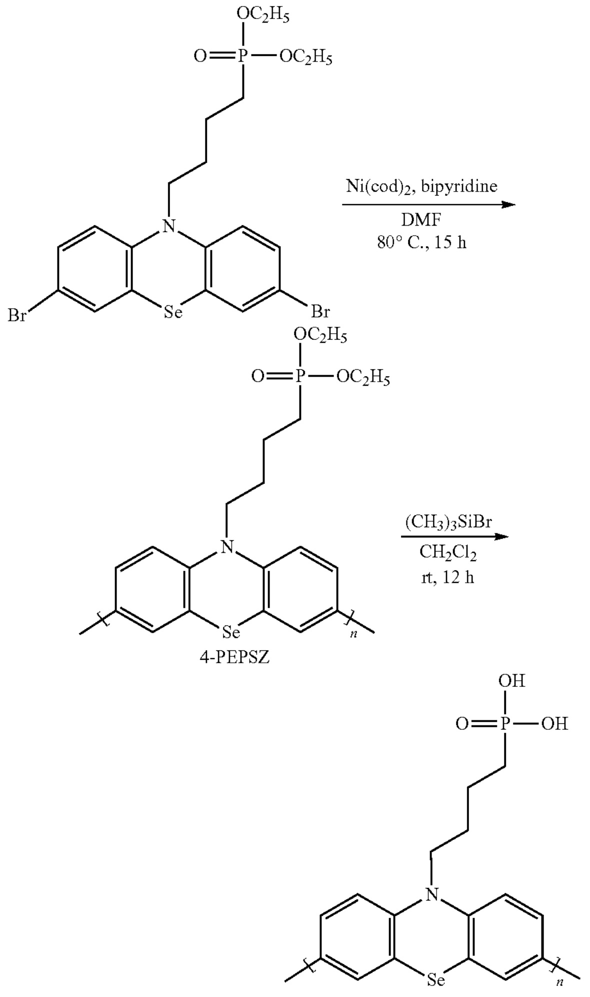

4-PEPSZ

4-PAPSZ

4-PEPSZ: The synthetic route of 4-PEPSZ is similar to that of 4-PEAd, excepting for using diethyl (4-(3,7-dibromo-10H-phenoselenazin-10-yl)butyl)phosphonate (632 mg, 1.06 mmol) to replace diethyl (4-(2,7-dibromo-9,9-dimethy-lacridin-10(9H)-yl)butyl)phosphonate. The crude product was dissolved in a minimum amount of $CH_2Cl_2$ and drop-wise into vigorously stirred solution of diethyl ether for 1-2 h or until a precipitate formed. The resulting polymer was filtered and washed with diethyl ether, yielding 190 mg of 4-PEPSZ as a grey solid in a yield of 41%. %. $^1$H-NMR ($CDCl_3$, 400 MHz) δ (ppm): 7.20 (m), 4.21 (m), 4.00 (m), 1.75 (m), 1.49 (m); SEC data: $M_n$=8.8×$10^3$ g $mol^{-1}$, Đ=2.05.

4-PAPSZ: The synthetic route of 4-PAPSZ is similar to that of 4-PAAd, excepting for using 60 mg of 4-PEPSZ. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 42 mg of 4-PAPSZ as a white solid in a yield of 80%. $^1H$-NMR ($CDCl_3$ and $CD_3OD$, 400 MHz) δ (ppm): 7.18 (m), 4.85 (m), 3.98 (m), 1.62 (m).

Example 15—Synthesis of Homopolymer 2-PPA

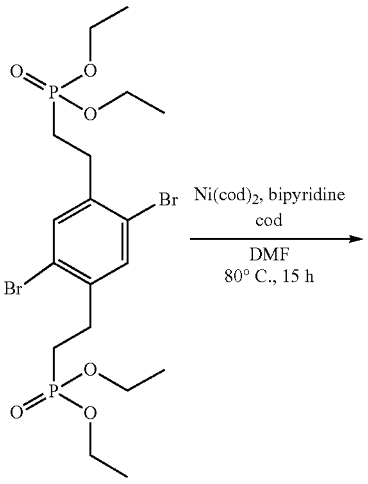

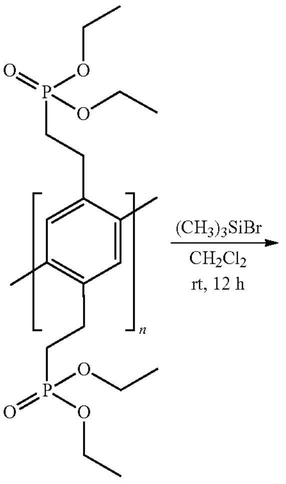

2-PPE

-continued

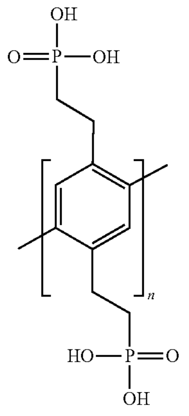

2-PPA

2-PPE: To a mixture of $Ni(COD)_2$ (470 mg, 1.70 mmol, 1.0 equiv.), 2,2'-bipyridine (263 mg, 1.70 mmol, 1.0 equiv.), and cyclooctadiene (184 mg, 1.70 mmol, 1.0 equiv.) was added 25 mL of anhydrous bubbled DMF under nitrogen atmosphere. The reaction mixture was stirred at 80° C. for 60 minutes. The reaction mixture was stirred at 80° C. for 60 minutes. Subsequently, tetraethyl ((2,5-dibromo-1,4-phenylene)bis(ethane-2,1-diyl))bis(phosphonate) (575 mg, 1.02 mmol, 0.6 equiv.) in 6 ml of anhydrous DMF was added dropwise to the reaction mixture. The resulting mixture was kept stirred at 80° C. for 18 h. It was cooled to room temperature and 1M HCl was added to adjust pH to 1-2. The resulting mixture was extracted with $CH_2Cl_2$ and the organic layer was washed with 1M HCl for three times. The organic layer was dried with anhydrous $Na_2SO_4$ and concentrated under reduced pressure. The crude product was dissolved in a minimum amount of $CH_2Cl_2$ and dropwise into vigorously stirred solution of diethyl ether for 1-2 h or until a precipitate formed. The resulting polymer was filtered and washed with diethyl ether, yielding 255 mg of 2-PPE as a grey solid in a yield of 60%. $^1H$-NMR ($CDCl_3$, 400 MHz) δ (ppm): 7.18 (m), 4.20 (m), 2.81 (m), 2.07 (m), 1.37 (m); SEC data: $M_n$=5.3x$10^3$ g $mol^{-1}$, Đ=2.73.

2-PPA: To a solution of 2-PPE (100 mg) in 15 mL of anhydrous $CH_2Cl_2$ was added the solution of bromotrimethylsilane (0.2 mL, 1.5 mmol) in 1 mL of anhydrous $CH_2Cl_2$ dropwise under an atmosphere of nitrogen. The reaction mixture was kept at 25° C. for 18 hours. The resulting mixture was quenched by 8 mL of MeOH, and the reaction mixture was stirred at room temperature for 12 h. The crude mixture was concentrated under reduced pressure. This residue was re-dissolved in a minimum amount of $CH_2Cl_2$ and MeOH, and the resulting solution was added dropwise into vigorously stirred solution of diethyl ether for 1-2 h or until a precipitate formed. The resulting polymer was filtered and washed with diethyl ether, undergoing repeated precipitation and filtration twice, yielding 78 mg of 2-PPA as a grey solid in a yield of 90%. $^1H$-NMR ($CDCl_3$ and $CD_3OD$, 400 MHz) δ (ppm): 7.20 (m), 2.85 (m), 2.0 (m).

Example 16—Device Performance Based on CPCN

The p-i-n-structured PSCs were fabricated with a planar heterojunction architecture of glass/ITO/CPCN (hole transporting material)/MA0.7FA0.3Pbl3 (1,000 nm thick)/C60/bathocuproine (BCP)/copper (Cu). Both HTMs and perovskite layers were processed via blade-coating method at ambient conditions. The best PSC based on Poly-CPCN delivered a PCE of 26.1%, along with an open-circuit voltage of 1.23V, a short-circuit current density of 25.6 mA $cm^{-2}$, and a fill factor (FF) of 0.83. The best cell based on CPCN was further held at a fixed bias of 1.05 V, or maximum power point (MPP), and a stabilized power output for 300 s was recorded. The current density was stabilized at 24.5 mA $cm^{-2}$, thus corresponding to a stabilized PCE of 25.7%.

The operational stability of encapsulated PSCs based on CPCN were monitored by connecting them to an automatic MPP tracker in air under simulated one sun illumination intensity of 100 mW $cm^{-2}$ (relative humidity 30-50%). No cooling or fans were used during the stability test, and the temperature of the cells was measured to be ~45° C. The CPCN-based cell exhibited excellent operational stability that 99.7% of initial efficiency was retained after 1,100-hour light soaking that could extrapolate to a T80 lifetime longer than 100,000 hours.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A polymer hole-transporting material, comprising a copolymer based on triarylamine monomer and carbazole monomer, triarylamine monomer comprises a backbone structure:

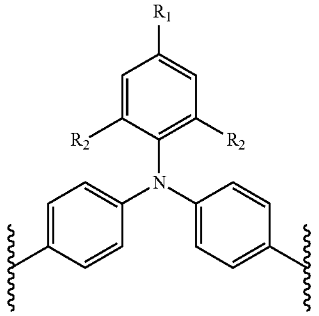

wherein $R_1$ is alkyl chain containing H, F, Cl, Br, I, CN, vinyl, acids or their combination;

$R_2$ is independently a straight chain or branched alkyl group and wherein one or more H atoms are optionally replaced by F, Cl, Br, I, or CN; and carbazole monomer contains an alkyl chain directly bonded to the nitrogen atom of the carbazole structure, and the alkyl chain is of 1 to 11 carbon atoms, and also has X terminal and Y terminal, wherein X is H or CN, Y is selected from:

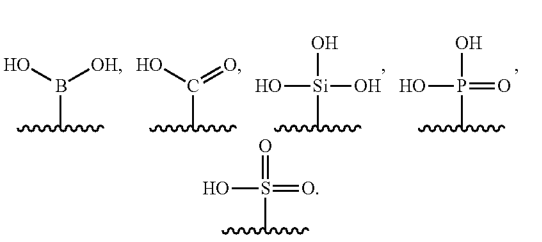

2. The polymer hole-transporting material of claim 1, wherein the carbazole monomer is selected from the group consisting of:

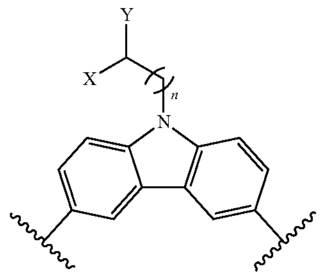

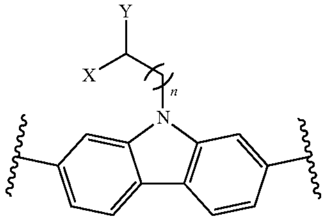

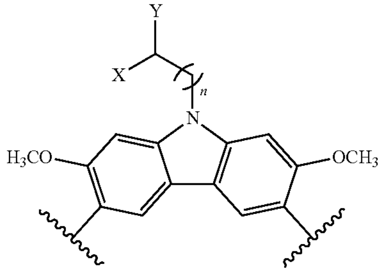

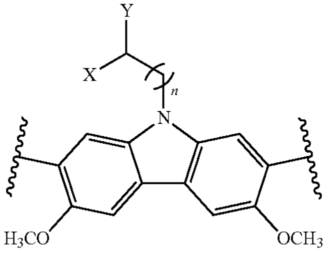

wherein X is independently H or CN;

n is independently selected from integers of 0 to 10; and

Y is independently selected from:

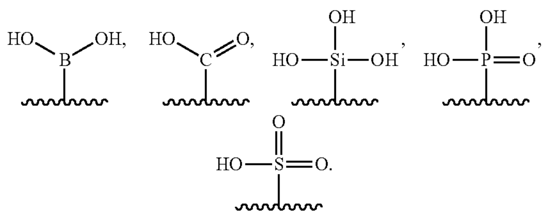

3. The polymer hole-transporting material of claim 2, wherein X is CN and Y is

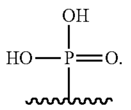

4. The polymer hole-transporting material of claim 1, wherein triarylamine monomer is selected from the group consisting of:

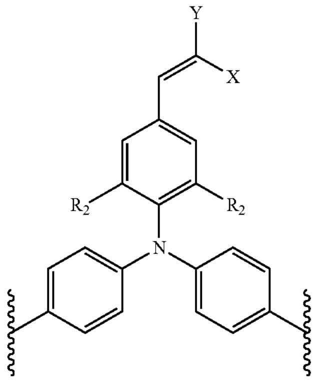

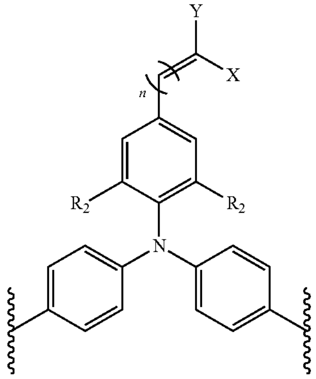

wherein X is independently H or CN;

n is independently selected from integers of 0 to 10; and

Y is independently selected from:

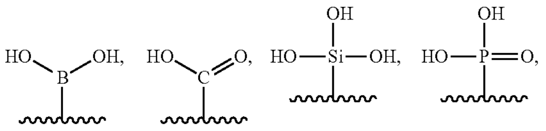

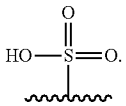

5. An inverted perovskite solar cell with a p-i-n architecture, wherein the inverted perovskite solar cell comprises a hole-transporting layer including the polymer hole-transporting material of claim 1.

6. The inverted perovskite solar cell according to claim 5, wherein the inverted perovskite solar cell is either a single-junction solar cell or at least one sub-cell of a multi-junction solar cell.

7. The inverted perovskite solar cell according to claim 5, wherein the inverted perovskite solar cell is arranged as an inverted perovskite sub-cell on a silicon heterojunction sub-cell in a tandem solar cell.

* * * * *